(12) United States Patent
Oh et al.

(10) Patent No.: US 10,580,933 B2
(45) Date of Patent: Mar. 3, 2020

(54) HIGHLY RELIABLE LIGHT EMITTING DIODE

(71) Applicant: SEOUL VIOSYS CO., LTD., Ansan-si (KR)

(72) Inventors: Se Hee Oh, Ansan-si (KR); Jong Kyu Kim, Ansan-si (KR); Hyun A Kim, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 0 days.

(21) Appl. No.: 15/971,931

(22) Filed: May 4, 2018

(65) Prior Publication Data

US 2018/0323236 A1 Nov. 8, 2018

(30) Foreign Application Priority Data

May 4, 2017 (KR) .......................... 10-2017-0056959

(51) Int. Cl.
| | |
|---|---|
| H01L 33/00 | (2010.01) |
| H01L 33/08 | (2010.01) |
| H01L 33/40 | (2010.01) |
| H01L 33/62 | (2010.01) |
| H01L 33/46 | (2010.01) |
| H01L 33/38 | (2010.01) |
| H01L 27/15 | (2006.01) |
| H01L 33/44 | (2010.01) |
| H01L 33/32 | (2010.01) |

(52) U.S. Cl.
CPC ............ *H01L 33/08* (2013.01); *H01L 27/156* (2013.01); *H01L 33/007* (2013.01); *H01L 33/38* (2013.01); *H01L 33/382* (2013.01); *H01L 33/385* (2013.01); *H01L 33/405* (2013.01); *H01L 33/44* (2013.01); *H01L 33/46* (2013.01); *H01L 33/62* (2013.01); *H01L 33/32* (2013.01); *H01L 2933/0016* (2013.01); *H01L 2933/0025* (2013.01); *H01L 2933/0066* (2013.01)

(58) Field of Classification Search
CPC ..... H01L 27/156; H01L 33/44; H01L 33/405; H01L 33/62; H01L 33/382; H01L 33/46; H01L 33/007; H01L 2933/0025; H01L 33/32; H01L 2933/0016; H01L 2933/0066; H01L 27/153; H01L 33/385; H01L 33/38; H01L 33/08
See application file for complete search history.

(56) References Cited

U.S. PATENT DOCUMENTS

| | | | |
|---|---|---|---|
| 9,111,840 B2* | 8/2015 | Heo | H01L 33/62 |
| 9,318,529 B2* | 4/2016 | Jang | H01L 27/153 |
| 9,929,316 B2* | 3/2018 | Emura | H01L 27/156 |
| 10,032,960 B2* | 7/2018 | Jeon | H01L 33/382 |
| 2012/0074441 A1* | 3/2012 | Seo | H01L 27/153 257/91 |

* cited by examiner

*Primary Examiner* — Shouxiang Hu
(74) *Attorney, Agent, or Firm* — Perkins Coie LLP

(57) ABSTRACT

Disclosed herein is a highly reliable light emitting diode. In the light emitting diode, a connector connecting light emitting cells to each other is spaced apart from bump pads in a lateral direction so as not to overlap each other. Accordingly, it is possible to provide a chip-scale flip-chip type light emitting diode having good properties in terms of heat dissipation performance and electrical reliability.

16 Claims, 15 Drawing Sheets

HIGHLY RELIABLE LIGHT EMITTING DIODE

CROSS-REFERENCE TO RELATED APPLICATION(S)

This patent document claims priority to and the benefit of Korean Patent Application No. 10-2017-0056959, filed on May 4, 2017, which is incorporated by reference for all purposes as if fully set forth herein.

TECHNICAL FIELD

Exemplary embodiments of the disclosed technology relate to a light emitting diode and, more particularly, to a highly reliable light emitting diode.

BACKGROUND

Recently, with good thermal stability and a direct transition type energy band structure, Group III-based nitrides, such as gallium nitride (GaN), aluminum nitride (AlN), and the like, have been spotlighted as materials for light sources in the visible range and the ultraviolet range. Particularly, blue and green light emitting diodes using indium gallium nitride (InGaN) are used in various fields including large full color flat panel displays, signal lamps, interior lighting, high density light sources, high resolution output systems, optical communication, and the like.

SUMMARY

Exemplary embodiments of the disclosed technology provide a light emitting diode capable of preventing electric short circuit between a bump pad and a conductive metal layer even if an insulation layer is damaged due to particles or electrical testing by a probe.

Exemplary embodiments of the disclosed technology provide a flip-chip type light emitting diode capable of enhancing light extraction efficiency while securing high electrical reliability.

In accordance with one exemplary embodiment of the disclosed technology, a light emitting diode includes: a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layer, the lower insulation layer having openings exposing the first conductivity type semiconductor layer and the ohmic reflection layer of each of the light emitting cells; a connector(s) disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to the ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the connector(s) is spaced apart from the first and second bump pads in a lateral direction so as not to overlap each other.

In accordance with another exemplary embodiment of the disclosed technology, a light emitting diode includes: a plurality of light emitting cells each including a first conductivity type semiconductor layer, an active layer, and a second conductivity type semiconductor layer; a lower insulation layer covering the light emitting cells and having a plurality of openings on each of the light emitting cells; a connector(s) disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to an ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the connector(s) is spaced apart from the first and second bump pads in a lateral direction so as not to overlap each other.

In accordance with a further exemplary embodiment of the disclosed technology, a light emitting diode includes: a plurality of light emitting cells each including a first conductivity type semiconductor layer, an active layer, and a second conductivity type semiconductor layer; a lower insulation layer covering the light emitting cells and having a plurality of openings on each of the light emitting cells; a connector(s) disposed on the lower insulation layer and electrically connecting adjacent light emitting cells to each other to form a series array of light emitting cells; at least one floating metal layer disposed on the lower insulation layer and spaced apart from the connector(s); an upper insulation layer covering the connector(s) and the at least one floating metal layer; a first bump pad disposed on the upper insulation layer and electrically connected to the first conductivity type semiconductor layer of one of the plurality of light emitting cells; and a second bump pad disposed on the upper insulation layer and electrically connected to the second conductivity type semiconductor layer of another light emitting cell of the plurality of light emitting cells, wherein the connector(s) is spaced apart from the first and second bump pads in a lateral direction so as not to overlap each other, and the at least one floating metal layer includes a floating metal layer partially overlapping one of the first and second bump pads.

Exemplary embodiments of the disclosed technology provide a light emitting diode, in which a connector(s) is spaced apart from first and second bump pads in the lateral direction, thereby preventing occurrence of short circuit between the connector(s) and the bump pads upon electrical testing using probes. Furthermore, the light emitting diode includes a floating metal layer to reflect light without occurrence of short circuit, thereby improving light extraction efficiency.

Other advantages and effects of the exemplary embodiments of the disclosed technology will become apparent from the following detailed description.

BRIEF DESCRIPTION OF THE DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION

Figure 1:
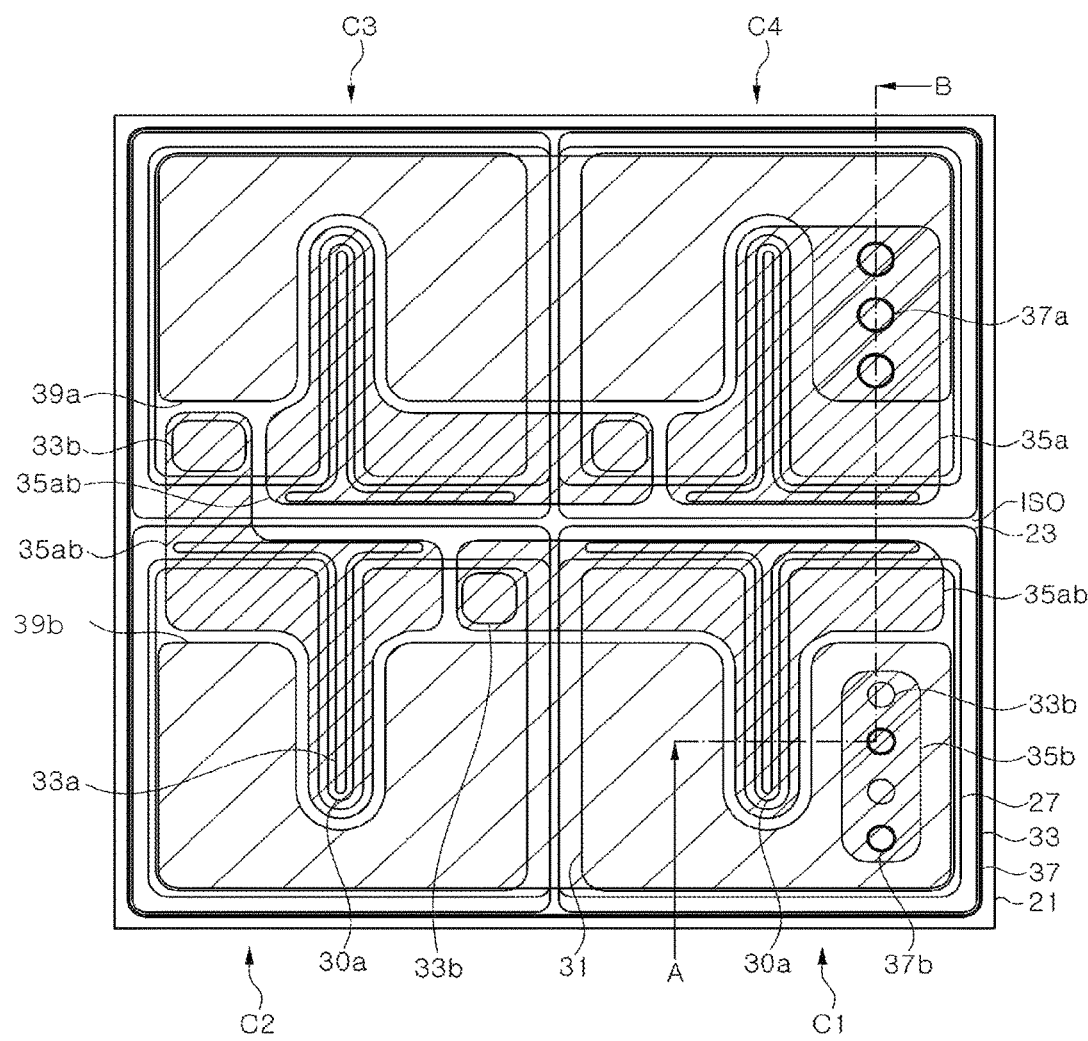
FIG. 1 is a schematic plan view of a light emitting diode according to one exemplary embodiment of the disclosed technology.

Hereinafter, exemplary embodiments of the disclosed technology will be described in detail with reference to the accompanying drawings. The following embodiments are provided by way of example so as to facilitate the understanding of the disclosed technology to those skilled in the art to which the disclosed technology pertains. Accordingly, the disclosed technology is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Light emitting diodes are generally used in the form of a package fabricated through a packaging process. In recent years, however, various studies have been made to develop a chip-scale package type light emitting diode, for which the packaging process is performed at a chip level. Such a light emitting diode has a smaller size than typical packages and does not require a separate packaging process, thereby enabling reduction in time and cost through process simplification. The chip-scale package type light emitting diode generally has a flip chip-shaped electrode structure and can dissipate heat through bump pads to secure good heat dissipation.

A light emitting diode includes a plurality of light emitting cells connected to each other in series. Such a light emitting diode can reduce the droop phenomenon through operation of a single light emitting diode at a higher voltage and a lower current. In order to connect the plurality of light emitting cells to each other in series, bump pads are electrically connected to opposite ends of the light emitting cells connected to each other in series. Generally, electric characteristics of a light emitting diode are measured through probes brought into contact with the bump pads. For reliable contact of the probes, the probes are pressed on the bump pads, thereby causing damage to the bum pads. Moreover, an insulation layer under the bump pads can also be damaged, thereby causing short circuit between the bump pads and a conductive metal layer disposed under the bump pads. Such short circuit results in failure of the light emitting diode.

Moreover, when the insulation layer is damaged due to contaminants such as particles on the conductive metal layer, short circuit can occur between the bump pads and the conductive metal layer through the insulation layer, thereby causing failure of the light emitting diode.

The disclosed technology provides a light emitting diode that can address the problems as discussed above and have more improved reliability. In accordance with one exemplary embodiment of the disclosed technology, a light emitting diode includes: a plurality of light emitting cells each including a first conductivity type semiconductor layer, an active layer, and a second conductivity type semiconductor layer; an ohmic reflection layer disposed on the second conductivity type semiconductor layer of each of the light emitting cells to form ohmic contact therewith; a lower insulation layer covering the light emitting cells and the ohmic reflection layer, the lower insulation layer having openings exposing the first conductivity type semiconductor layer and the ohmic reflection layer of each of the light emitting cells; a connector(s) disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to the ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the connector(s) is spaced apart from the first and second bump pads in a lateral direction so as not to overlap each other.

Since the connector(s) is spaced apart from the first and second bump pads in the lateral direction, electric short circuit does not occur between the connector(s) and the bump pads even upon damage to the upper insulation layer by probes or particles.

Each of the light emitting cells may at least partially overlap at least one of the first and second bump pads. With the structure wherein each of the light emitting cells is disposed to overlap the first bump pad and/or the second bump pad, the light emitting diode allows heat from all of the light emitting cells to be discharged through the first and/or second bump pads.

Each of the first and second bump pads may be disposed over at least two light emitting cells. Accordingly, heat generated from the light emitting cells can be distributed to the first and second bump pads instead of being concentrated on one bump pad. In addition, the first and second bump pads can be formed in a relatively large size to facilitate mounting of the light emitting diode.

The first pad metal layer may be limitedly disposed in an upper region of the last light emitting cell and the second pad metal layer may be limitedly disposed in an upper region of the first light emitting cell. Since the first and second pad metal layers do not connect the light emitting cells to each other, the first and second pad metal layers are distinguished from the connector. Accordingly, the first and second pad metal layers are spaced apart from the connector(s).

The connectors and the first and second pad metal layers may be formed of the same material and placed at the same level. Herein, the "same level" means the same process rather than the same height. The connectors and the first and second pad metal layers are formed on the same morphology of the substrate after the morphology of the substrate is determined. Accordingly, the connectors and the first and second pad metal layers can be regarded as being placed at the same level so long as the connectors and the first and second pad metal layers can be formed by the same process despite having different heights. Accordingly, a certain portion may be formed at a lower location or a higher location than other portions. After the lower insulation layer is formed, the connectors and the first and second pad metal layers may be formed at the same time by the same process and thus can be placed at the same level.

The openings of the lower insulation layer exposing the ohmic reflection layer may be spaced apart from the openings of the upper insulation layer exposing the second pad metal layer in the lateral direction so as not to overlap each other. Accordingly, it is possible to efficiently block solders from diffusing into the ohmic reflection layer upon mounting of the first and second bump pads on a submount or a printed circuit board via the solders.

In some exemplary embodiments, at least one light emitting cell may include a bay or a via-hole formed through the second conductivity type semiconductor layer and the active layer to expose the first conductivity type semiconductor layer, and the connector may be electrically connected to the first conductivity type semiconductor layer of the light emitting cell through the bay or via-hole.

The upper insulation layer may cover a region between an edge of the substrate and the light emitting cells and a distance from an edge of the upper insulation layer to the connector may be 15 µm or more. With the structure wherein the connector is sufficiently spaced apart from the edge of the upper insulation layer, the light emitting diode can protect the connector from moisture permeating through the edge of the upper insulation layer.

The connectors may directly contact the first conductivity type semiconductor layer and the ohmic reflection layer exposed through the openings of the lower insulation layer.

In some exemplary embodiments, the light emitting diode may further include at least one floating metal layer disposed on the lower insulation layer and covered by the upper insulation layer, wherein each floating metal layer is insulated from the first pad metal layer, the second pad metal layer and the connector(s). With the floating metal layer, the light emitting diode can improve light extraction efficiency by reflecting light generated from the active layer.

Herein, the "floating" metal layer means that the metal layer is electrically insulated from metallic material layers, such as the first and second pad metal layers and the connector, which form a current path. The floating metal layer is also insulated from a semiconductor stack and the ohmic reflection layer by the lower insulation layer. Accordingly, even when electric short circuit occurs between the floating metal layer and the first and second bump pads, the light emitting diode is not damaged.

The at least one floating metal layer may be formed of the same material as the connector and the first and second pad metal layers.

The at least one floating metal layer may include a floating metal layer partially covering a region between two adjacent light emitting cells. The floating metal layer disposed between two adjacent light emitting cells can reflect light emitted from the region between the adjacent light emitting cells.

The at least one floating metal layer may include a plurality of floating metal layers. At least one of the floating metal layers may have the same shape as the second pad metal layer.

The light emitting diode may further include a substrate on which the plurality of light emitting cells is disposed.

In accordance with another exemplary embodiment of the disclosed technology, a light emitting diode includes: a plurality of light emitting cells each including a first conductivity type semiconductor layer, an active layer, and a second conductivity type semiconductor layer; a lower insulation layer covering the light emitting cells and having a plurality of openings on each of the light emitting cells; a connector(s) disposed on the lower insulation layer and electrically connecting adjacent light emitting cells to each other to form a series array of light emitting cells; a first pad metal layer electrically connected to the first conductivity type semiconductor layer of the last light emitting cell disposed at the last terminal of the series array through the opening of the lower insulation layer; a second pad metal layer electrically connected to an ohmic reflection layer of a first light emitting cell disposed at the first terminal of the series array through the opening of the lower insulation layer; an upper insulation layer covering the connector(s) and the first and second pad metal layers, the upper insulation layer having openings exposing upper surfaces of the first and second pad metal layers, respectively; and a first bump pad and a second bump pad connected to upper surfaces of the first pad metal layer and the second pad metal layer exposed through the openings of the upper insulation layer, respectively, wherein the connector(s) is spaced apart from the first and second bump pads in a lateral direction so as not to overlap each other.

In accordance with a further exemplary embodiment of the disclosed technology, a light emitting diode includes: a plurality of light emitting cells each including a first conductivity type semiconductor layer, an active layer, and a second conductivity type semiconductor layer; a lower insulation layer covering the light emitting cells and having a plurality of openings on each of the light emitting cells; a connector(s) disposed on the lower insulation layer and electrically connecting adjacent light emitting cells to each other to form a series array of light emitting cells; at least one floating metal layer disposed on the lower insulation layer and spaced apart from the connector(s); an upper insulation layer covering the connector(s) and the at least one floating metal layer; a first bump pad disposed on the upper insulation layer and electrically connected to the first conductivity type semiconductor layer of one of the plurality of light emitting cells; and a second bump pad disposed on the upper insulation layer and electrically connected to the second conductivity type semiconductor layer of another light emitting cell of the plurality of light emitting cells, wherein the connector(s) is spaced apart from the first and second bump pads in a lateral direction so as not to overlap each other, and the at least one floating metal layer includes a floating metal layer at least partially overlapping one of the first and second bump pads.

The at least one floating metal layer may include a floating metal layer partially covering a region between the light emitting cells.

The at least one floating metal layer may include a floating metal layer limitedly disposed on one of the light emitting cells.

The light emitting diode may further include: a first pad metal layer electrically connected to the first conductivity type semiconductor layer of one of the plurality of light emitting cells through the opening of the lower insulation layer; and a second pad metal layer electrically connected to the second conductivity type semiconductor layer of another light emitting cell of the plurality of light emitting cells through the opening of the lower insulation layer, wherein the first pad metal layer and the second pad metal layer at least partially overlap the first and second bump pads, respectively, and the connector(s) is spaced apart from the first and second pad metal layers.

Now, exemplary embodiments of the disclosed technology will be described in detail with reference to the accompanying drawings.

Figure 2:
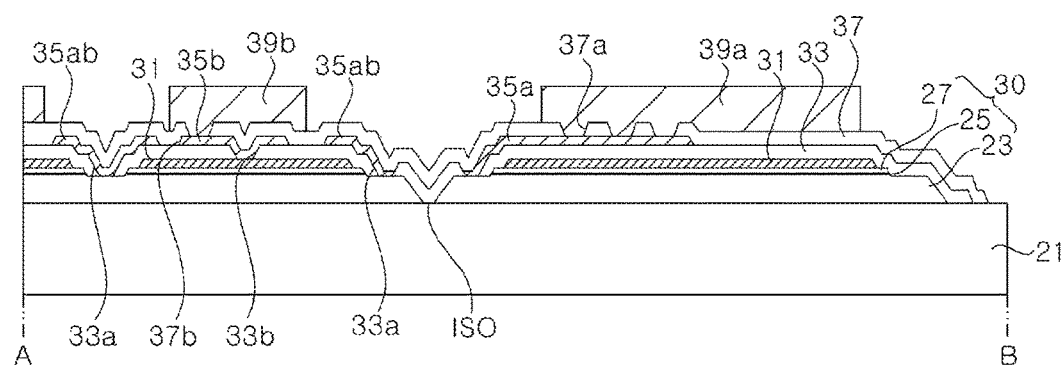
FIG. 2 is a schematic cross-sectional view taken along line A-B of FIG. 1.
Figure 3:
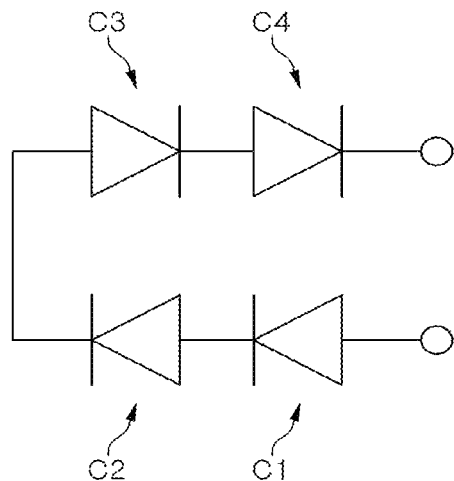
FIG. 3 is a schematic circuit diagram of the light emitting diode of FIG. 1.

FIG. 1 is a schematic plan view of a light emitting diode according to one exemplary embodiment of the disclosed technology, FIG. 2 is a schematic cross-sectional view taken along line A-B of FIG. 1, and FIG. 3 is a schematic circuit diagram of the light emitting diode of FIG. 1.

Referring to FIG. 1, FIG. 2 and FIG. 3, the light emitting diode includes a substrate 21, a plurality of light emitting cells C1 to C4, an ohmic reflection layer 31, a lower insulation layer 33, a first pad metal layer 35a, a second pad metal layer 35b, connectors 35ab, an upper insulation layer 37, a first bump pad 39a, and a second bump pad 39b. Each of the light emitting cells C1 to C4 includes a semiconductor stack structure 30, which includes a first conductivity type semiconductor layer 23, an active layer 25, and a second conductivity type semiconductor layer 27.

The substrate 21 may be selected from any substrates suitable for growth of gallium nitride semiconductor layers thereon. The substrate 21 may include, for example, a sapphire substrate, a gallium nitride substrate, a SiC substrate, or others, and may be a patterned sapphire substrate. The substrate 21 may have a rectangular or square shape, as shown in FIG. 1, without being limited thereto. The size of the substrate 21 is not particularly limited and may be selected in various ways.

The light emitting cells C1 to C4 are separated from each other on the substrate 21. Although four light emitting cells C1 to C4 are shown in this exemplary embodiment, the number of light emitting cells can be selected in various ways. Particularly, the light emitting diode may include at least two light emitting cells.

Each of the light emitting cells C1 to C4 includes the first conductivity type semiconductor layer 23. The first conductivity type semiconductor layer 23 is disposed on the substrate 21. The first conductivity type semiconductor layer 23 may be or include a gallium nitride semiconductor layer grown on the substrate 21 and doped with dopants, for example Si.

The active layer 25 and the second conductivity type semiconductor layer 27 are disposed on the first conductivity type semiconductor layer 23. The active layer 25 is interposed between the first conductivity type semiconductor layer 23 and the second conductivity type semiconductor layer 27. The active layer 25 and the second conductivity type semiconductor layer 27 may have a smaller area than the first conductivity type semiconductor layer 23. The active layer 25 and the second conductivity type semiconductor layer 27 may be formed in a mesa shape on the first conductivity type semiconductor layer 23 through mesa etching.

The light emitting cells C1 to C4 may be arranged such that external edges of the first conductive type semiconductor layers 23, which face an edge of the substrate 21, are spaced apart from an edge of the mesa. For example, some external edges of the first conductive type semiconductor layer 23 may be spaced apart from the edges of active layers 25 and the edges of the second conductive type semiconductor layers 27. Among edges of the light emitting cells C1 to C4, for edges of the light emitting cells C1 to C4 adjacent to an edge of the substrate 21, an edge of the first conductivity type semiconductor layer 23 may be spaced apart from an edge of the mesa, for example, from the edges of the active layer 25 and the second conductivity type semiconductor layer 27. Thus, an upper surface of the first conductivity type semiconductor layer 23 is partially exposed outside the mesa. The first conductive type semiconductor layer 23 is located apart from the edge of the substrate 21 by a first distance and the active layer 25 is located apart from the edge of the substrate 21 by a second distance greater than the first distance. Since the active layer 25 is spaced apart farther from the edge of the substrate than the first conductivity type semiconductor layer 23 is, the active layer 25 can be prevented from being damaged during a process of separating the substrate with laser beams.

For at least one internal edge of one of the light emitting cells C1 to C4 that faces adjacent light emitting cells, the edge of the first conductivity type semiconductor layer 23 may be aligned to the edges of the active layer 25 and the second conductivity type semiconductor layer 27. For example, the edges of the first conductivity type semiconductor layer 23, the active layer 25, and the second conductivity type semiconductor layer 27 of the first light emitting cell C1 facing the light emitting cell C2 form a same inclined surface. Similarly, the edges of the first conductivity type semiconductor layer 23, the active layer 25, and the second conductivity type semiconductor layer 27 of the third light emitting cell C3 facing the light emitting cell C4 form a same inclined surface. In this structure, the upper surface of the first conductivity type semiconductor layer 23 may not be exposed in regions where the light emitting cells face each other. Accordingly, the light emitting diode can secure luminous areas of the light emitting cells C1 to C4. Here, in order to expose the upper surface of the first conductivity type semiconductor layer 23, at some edges of the light emitting cells among the edges of the light emitting cells C1 to C4 facing each other, the edges of the active layer 25 and the second conductivity type semiconductor layer 27 may be spaced apart from the edge of the first conductivity type semiconductor layer 23.

The active layer 25 may have a single quantum well structure or a multiple-quantum well structure. In the active layer 25, the compositions and thicknesses of well layers determine the wavelength of light generated in the active layer 25. In particular, the active layer can generate UV light, blue light or green light through adjustment of the compositions of the well layers.

The second conductivity type semiconductor layer 27 may be or include a gallium nitride semiconductor layer doped with p-type dopants, for example, Mg. Each of the first conductivity type semiconductor layer 23 and the second conductivity type semiconductor layer 27 may be composed of a single layer or multiple layers and may include super-lattice layers. The first conductivity type semiconductor layer 23, the active layer 25 and the second conductivity type semiconductor layer 27 may be grown on the substrate in a chamber by a well-known method, such as metal organic chemical vapor deposition (MOCVD) or molecular beam epitaxy (MBE).

Each of the light emitting cells C1 to C4 includes bays 30a formed through the second conductivity type semiconductor layer 27 and the active layer 25 to expose the first conductivity type semiconductor layer 23. The bays 30a extend from one edge of the light emitting cell into the interior of the light emitting cell. The first conductivity type semiconductor layer 23 may be exposed not only outside the active layer 25 and the second conductivity type semiconductor layer 27 but also through the bays 30a such that the exposed regions of the first conductivity type semiconductor layer 23 can be connected to each other. Alternatively, each of the light emitting cells may include via-holes surrounded by the active layer 25 and the second conductivity type semiconductor layer 27 to expose a portion of the upper surface of the first conductivity type semiconductor layer 23, instead of the bays 30a. As shown in the drawings, the bays 30a may have an elongated shape and may pass through the center of each of the light emitting cells C1 to C4. Although it is shown that each of light emitting cells C1 to C4 includes a bay 30a, it is possible that each of the light emitting cells may include a plurality of bays 30a. In some implementations, the numbers of bays 30a formed in the light emitting cells C1 to C4 are not same for the light emitting C1 to C4 and may be different among the light emitting cells C1 to C4.

The ohmic reflection layer 31 is disposed on the second conductivity type semiconductor layer 27 and is electrically connected to the second conductivity type semiconductor layer 27. The ohmic reflection layer 31 may be disposed over substantially the entire region of the second conductivity type semiconductor layer 27 in an upper region of the second conductivity type semiconductor layer 27. For example, the ohmic reflection layer 31 may cover 80% or more, further, 90% or more of the upper region of the second conductivity type semiconductor layer 27. Here, in order to prevent damage to ohmic reflection layer due to moisture permeating through a cell isolation (ISO) region or the edge of the substrate, the edge of the ohmic reflection layer 31 may be disposed inside a cell region that is located inwardly from the edge of the second conductivity type semiconductor layer 27. In some implementations, the edge of the ohmic reflection layer 31 is spaced apart from the edge of the second conductivity type semiconductor layer 27.

The ohmic reflection layer 31 may include a metal layer having reflectivity and thus can reflect light generated from the active layer 25 and travelling to the ohmic reflection layer 31, toward the substrate 21. For example, the ohmic reflection layer 31 may be composed of a single reflection metal layer, but is not limited thereto. Alternatively, the ohmic reflection layer 31 may include an ohmic layer and a reflection layer. The ohmic layer may be or include a metal layer such as a Ni layer or a transparent oxide layer such as an ITO layer, and the reflection layer may be or include a metal layer having high reflectance such as an Ag or Al layer.

The lower insulation layer 33 covers the light emitting cells C1 to C4 and the ohmic reflection layer 31. The lower insulation layer 33 may cover not only the upper surfaces of the light emitting cells C1 to C4, but also side surfaces of the light emitting cells C1 to C4 along the peripheries thereof so as to cover a portion of the substrate around the light emitting cells C1 to C4. In some implementations, the lower insulation layer 33 covers the cell isolation (ISO) region between the light emitting cells C1 to C4 while partially covering the first conductivity type semiconductor layer 23 exposed in the bays 30a.

The lower insulation layer 33 includes first openings 33a exposing the first conductivity type semiconductor layers and second openings 33b exposing the ohmic reflection layers 31. The first openings 33a expose the first conductivity type semiconductor layers 23 in the bays 30a and may partially expose the upper surface of the first conductivity type semiconductor layers 23 along the edges of the light emitting cells C1 to C4. Furthermore, the lower insulation layer 33 may expose the upper surface of the substrate 21 along the edge of the substrate 21.

The second opening 33b is disposed on the ohmic reflection layer 31 to expose the ohmic reflection layer 31. The location and shape of the second opening 33b may be modified in various ways for arrangement and electrical connection of the light emitting cells C1 to C4. In addition, although one or two second openings 33b are disposed on each of the light emitting cells in FIG. 1, it should be understood that various numbers of second openings may be disposed on each of the light emitting cells, as needed.

The lower insulation layer 33 may be formed of a single layer including $SiO_2$ or $Si_3N_4$, without being limited thereto. In some implementations, the lower insulation layer 33 may have a multilayer structure which includes a silicon oxide layer and a silicon nitride layer, and may include a distributed Bragg reflector in which material layers having different indices of refraction, such as $SiO_2$ layers, $TiO_2$ layers, $ZrO_2$ layers, $MgF_2$ layers, or $Nb_2O_5$ layers, are alternately laminated one above another. In addition, the lower insulation layer 33 may have the same stack structure therethrough. Alternatively, some portion of the lower insulation layer may include a greater number of layers than the other portion thereof. Particularly, a portion of the lower insulation layer 33 on the ohmic reflection layer 31 may have a greater thickness than a portion of the lower insulation layer 33 around the ohmic reflection layer 31.

The first pad metal layer 35a, the second pad metal layer 35b, and the connectors 35ab are disposed on the lower insulation layer 33 such that the light emitting cells C1 to C4 are electrically connected to one another in series. Referring to FIG. 3, the electrical series connection of the light emitting cells C1 to C4 includes the light emitting cells C1 and the light emitting cells C4 as first and last light emitting cells coupled to electrical terminals and the light emitting cells C2 and the light emitting cells C3 arranged between the light emitting cell C1 and the light emitting cell C4. The second pad metal layer 35b is disposed on the first light emitting cell C1 and the first pad metal layer 35a is disposed on the last light emitting cell C4. The connectors 35ab are disposed over two light emitting cells and electrically connect the light emitting cells C1 to C4 to each other. Accordingly, as shown in FIG. 3, the four light emitting cells C1 to C4 of FIG. 1 are connected to one another in series by the connectors 35ab to form a series array of light emitting cells. Here, the first light emitting cell C1 is placed at the first terminal of the series array and the fourth light emitting cell C4 corresponding to the last light emitting cell is placed at the last terminal of the series array.

Referring again to FIG. 1, the first pad metal layer 35a may be limitedly disposed in an upper region of the last light emitting cell C4, specifically in an upper region of the second conductivity type semiconductor layer 27 of the last light emitting cell C4. The first pad metal layer 35a is electrically connected to the first conductivity type semiconductor layer 23 of the last light emitting cell C4 through the first opening 33a of the lower insulation layer 33. The first pad metal layer 35a may directly contact the first conductivity type semiconductor layer 23 through the first opening 33a.

The second pad metal layer 35b may be limitedly disposed in an upper region of the first light emitting cell C1, specifically in an upper region of the second conductivity type semiconductor layer 27 of the first light emitting cell C1. The second pad metal layer 35b is electrically connected to the ohmic reflection layer 31 on the first light emitting cell C1 through the second opening 33b of the lower insulation layer 33. The second pad metal layer 35b may directly contact the ohmic reflection layer 31 through the second opening 33b.

The connectors 35ab electrically connect adjacent light emitting cells to each other. Each of the connectors 35ab is electrically connected to the first conductivity type semiconductor layer 23 of one light emitting cell and is also electrically connected to the ohmic reflection layer 31 of another light emitting cell adjacent thereto and thus to the second conductivity type semiconductor layer 27 thereof to connect the light emitting cells to each other in series. Specifically, each of the connectors 35ab may be electrically connected to the first conductivity type semiconductor layer 23 exposed through the first opening 33a of the lower insulation layer 33 and may also be electrically connected to the ohmic reflection layer 31 exposed through the second opening 33b thereof. Furthermore, the connectors 35ab may directly contact the first conductivity type semiconductor layer 23 and the ohmic reflection layer 31.

Each of the connectors 35ab has a portion located over the cell isolation (ISO) region between two adjacent light emitting cells. For example, in a plan view, each of the connectors 35ab passes the cell isolation (ISO) region between the light emitting cells. Each of the connectors 35ab may be located to pass or cross an upper region of only one edge of a plurality of edges of the first conductivity type semiconductor layer 23. With this structure, the area of the connector 35ab disposed on the cell isolation (ISO) region can be reduced. Furthermore, in order to connect adjacent light emitting cells to each other, all of other portions of the connector 35ab excluding a portion of the connector 35ab passing or crossing the cell isolation (ISO) region are limitedly disposed on the light emitting cells. For example, each of the light emitting cells C1 to C4 may have a rectangular shape, as shown in FIG. 1, and thus has four edges. The connector 35ab is located to pass or cross only one edge of the four edges of one light emitting cell and not to pass or cross other remaining edges of the four edges of one light emitting cell. In some implementations, the connector 35ab may located inwardly from the other remaining edges of one light emitting cell and spaced apart in a plan view from the remaining edges of the light emitting cell.

The cell isolation (ISO) region is a region, in which the substrate 21 is exposed through removal of the semiconductor stack structure 30 by etching, and has a greater depth than the light emitting cells C1 to C4 to undergo significant variation in morphology. Accordingly, the lower insulation layer 33 and the connector 35ab covering the cell isolation (ISO) region undergo significant variation in morphology, that is, a significant height variation, near the cell isolation (ISO) region. The connector 35ab passes the cell isolation (ISO) region, which undergoes significant variation in morphology, to connect two adjacent light emitting cells. As a result, the connector 35ab can suffer from various problems, particularly, damage by external environments. Accordingly, reliability of the light emitting diode can be improved by reducing the area of the connector 35ab disposed on the cell isolation (ISO) region.

The first pad metal layer 35a, the second pad metal layer 35b, and the connectors 35ab may be formed of or including the same material by the same process after formation of the lower insulation layer 33, and thus may be placed at the same level. In addition, each of the first pad metal layer 35a, the second pad metal layer 35b, and the connectors 35ab may include a portion disposed on the lower insulation layer 33, without being limited thereto.

Each of the first and second pad metal layers 35a, 35b and the connector 35ab may include a reflection layer, such as an Al layer, which may be formed on a bonding layer, such as a Ti, Cr or Ni layer. Further, a protection layer may be formed in a single layer or composite layer structure including Ni, Cr, or Au on the reflection layer. The first and second pad metal layers 35a, 35b and the connectors 35ab may have a multilayer structure of or including, for example, Cr/Al/Ni/Ti/Ni/Ti/Au/Ti.

The upper insulation layer 37 covers the first and second pad metal layers 35a, 35b, 35c and the connectors 35ab. In addition, the upper insulation layer 37 may cover an edge of the lower insulation layer 33 along the periphery of each of the light emitting cells C1 to C4. Here, the upper insulation layer 37 may expose the upper surface of the substrate 21 along the edge of the substrate 21. The shortest distance from the edge of the upper insulation layer 37 to the connector 35ab is set to prevent damages to the connectors 35ab due to moisture permeation. Thus, the longer the shortest distance is, the better it is to prevent moisture permeation. In some implementations, the shortest distance from the edge of the upper insulation layer 37 to the connector 35ab may be about 15 μm or more. If the shortest distance therebetween is less than about 15 μm, the connectors 35ab are likely to be damaged due to moisture upon operation of the light emitting diode at low current, for example, 25 mA.

The upper insulation layer 37 includes first openings 37a exposing the first pad metal layer 35a and second openings 37b exposing the second pad metal layer 35b. The first openings 37a and the second openings 37b are disposed in some regions of the last light emitting cell C4 and the first light emitting cell C1, respectively. The other regions of the light emitting cells C1 to C4 excluding the first and second openings 37a, 37b may be covered by the upper insulation layer 37. Accordingly, upper and side surfaces of the connectors 35ab may be covered by the upper insulation layer 37 to be sealed thereby.

In one exemplary embodiment, the second openings 37b of the upper insulation layer 37 and the second openings 33b of the lower insulation layer 33 are formed on different positions along a direction parallel to a surface of the substrate 21. For example, the second openings 37b of the upper insulation layer 37 are spaced apart from the second openings 33b of the lower insulation layer 33 along a direction along which the light emitting cells C1 and C4 are arranged. The second openings 37b of the upper insulation layer 37 and the second openings 33b of the lower insulation layer 33 are arranged so as not to overlap each other, as shown in FIG. 1. With this structure, even when solders enter the second openings 37b of the upper insulation layer 37, the solders can be prevented from diffusing into the second openings 33b of the lower insulation layer 33, thereby preventing contamination of the ohmic reflection layer 31 by the solders. Alternatively, the second openings 37b of the upper insulation layer 37 may be disposed to overlap the second openings 33b of the lower insulation layer 33.

The upper insulation layer 37 may be formed of or including a single layer of $SiO_2$ or $Si_3N_4$, but is not limited thereto. For example, the upper insulation layer 37 may have a multilayer structure which includes a silicon oxide layer and a silicon nitride layer, and may include a distributed Bragg reflector in which material layers having different indices of refraction, such as $SiO_2$ layers, $TiO_2$ layers, $ZrO_2$ layers, $MgF_2$ layers, or $Nb_2O_5$ layers, are alternately laminated one above another.

As shown in FIG. 1, the first and second bump pads 39a, 39b may be disposed over the plurality of light emitting cells. With this structure, the first and second bump pads 39a, 39b may be formed in a relatively large size, thereby facilitating mounting of the light emitting diode. Furthermore, the first and second bump pads 39a, 39b may be used to dissipate heat from each of the light emitting cells.

In some implementations, the first bump pad 39a electrically contacts the first pad metal layer 35a exposed through the first openings 37a of the upper insulation layer 37, and the second bump pad 39b electrically contacts the second pad metal layer 35b exposed through the second openings 37b. Thus, at least part of the first pad metal layer 35a overlaps the first bump pad 39a and at least part of the second pad metal layer 35b overlaps the second bump pad 39b. Further, as shown in FIG. 1, the first bump pad 39a covers and seals all of the first openings 37a of the upper insulation layer 37 and the second bump pad 39b covers and seals all of the second openings 37b of the upper insulation layer 37.

In some implementations, as shown in FIG. 1, the connectors 35ab are arranged between the first and second bump pads 39a, 39b along a direction. The connectors 35ab are spaced apart from the first and second bump pads 39a, 39b in the lateral direction so as not to overlap each other. In this case, the third and fourth light emitting cells C3 and C4 are adjacent to the second and first light emitting cells C2 and C1, respectively, along the direction. The direction might be parallel to one edge of the light emitting cell. In addition, the connectors 35ab may cover the bays 30a and the first and second bump pads 39a, 39b may be spaced apart from the bays 30a.

Since the connectors 35ab do not overlap the first and second bump pads 39a, 39b, it is possible to prevent occurrence of short circuit between the first and second bump pads 39a, 39b and the connectors 35ab, even if the upper insulation layer 37 is damaged by probes or particles.

Further, since the lower insulation layer 33 and the upper insulation layer 37 are stacked between the ohmic reflection layer 31 and the first and second bump pads 39a, 39b, it is possible to prevent occurrence of short circuit therebetween, even if the upper insulation layer 37 is damaged.

Furthermore, each of the first bump pad 39a and the second bump pad 39b may be disposed over the light emitting cells that are continuously connected to each other in series. For example, referring to FIG. 1, the first bump pad 39a is disposed over the upper regions of the third and fourth light emitting cells C3, C4, and the second bump pad 39b is disposed over the upper regions of the first and second light emitting cells C1, C2. With this arrangement, it is possible to reduce a potential difference between the bump pads 39a, 39b and the light emitting cells C1 to C4 to a relatively low value.

The first bump pad 39a and the second bump pad 39b are portions of the light emitting diode bonded to a submount or a printed circuit board and are formed of a material suitable for bonding. For example, the first and second bump pads 39a, 39b may include an Au layer or an AuSn layer.

The structure of the light emitting diode according to the exemplary embodiment is described above in detail and will become more apparent through a method of manufacturing the light emitting diode described below.

FIGS. 4A to 4G are schematic sectional views illustrating a method of manufacturing the light emitting diode according to the exemplary embodiment of the disclosed technology.

Figure 4A:
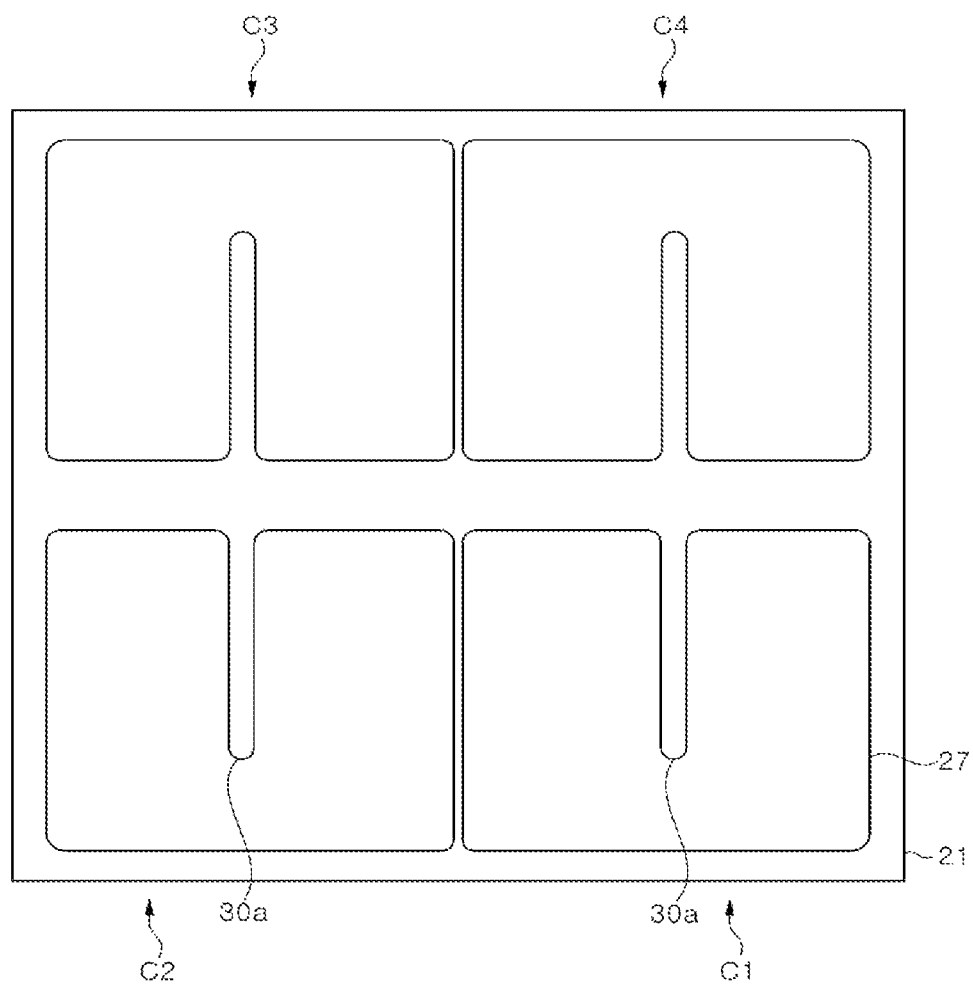
FIGS. 4A-4G are schematic sectional views illustrating a method of manufacturing the light emitting diode according to the exemplary embodiment of the disclosed technology.

First, referring to FIG. 2 and FIG. 4A, a semiconductor stack structure 30 including a first conductivity type semiconductor layer 23, an active layer 25 and a second conductivity type semiconductor layer 27 is grown on a substrate 21. The substrate 21 may be selected from any substrates suitable for growth of gallium nitride semiconductor layers thereon and may include, for example, a sapphire substrate, a silicon carbide substrate, a gallium nitride (GaN) substrate, a spinel substrate, or others. In some implementations, the substrate may have a patterned portion, such as a patterned sapphire substrate.

The first conductivity type semiconductor layer 23 may include, for example, an n-type gallium nitride layer, and the second conductivity type semiconductor layer 27 may include a p-type gallium nitride layer. In addition, the active layer 25 may have a single quantum well structure or a multiple-quantum well structure and may include a well layer and a barrier layer. The composition of the well layer may be determined depending upon the wavelength of light to be emitted and may include, for example, AlGaN, GaN or InGaN.

Then, mesas are formed on a plurality of light emitting cells C1 to C4 to be separated from each other by patterning the active layer 25 and the second conductivity type semiconductor layer 27. For example, a mesa forming process is performed to expose an upper surface of the first conductivity type semiconductor layer 23. The mesas may have inclined side surfaces. Accordingly, the upper surface of the first conductivity type semiconductor layer 23 outside the mesas can be exposed and bays 30 can be formed in regions corresponding to the light emitting cells to extend into the mesas, respectively. Although the bays 30a are formed in this exemplary embodiment, via-holes surrounded by the active layer 25 and the second conductivity type semiconductor layer 27 may also be formed.

The upper surface of the first conductivity type semiconductor layer 23 is exposed along the periphery of the second conductivity type semiconductor layer 27 and the active layer 25.

Figure 4B:
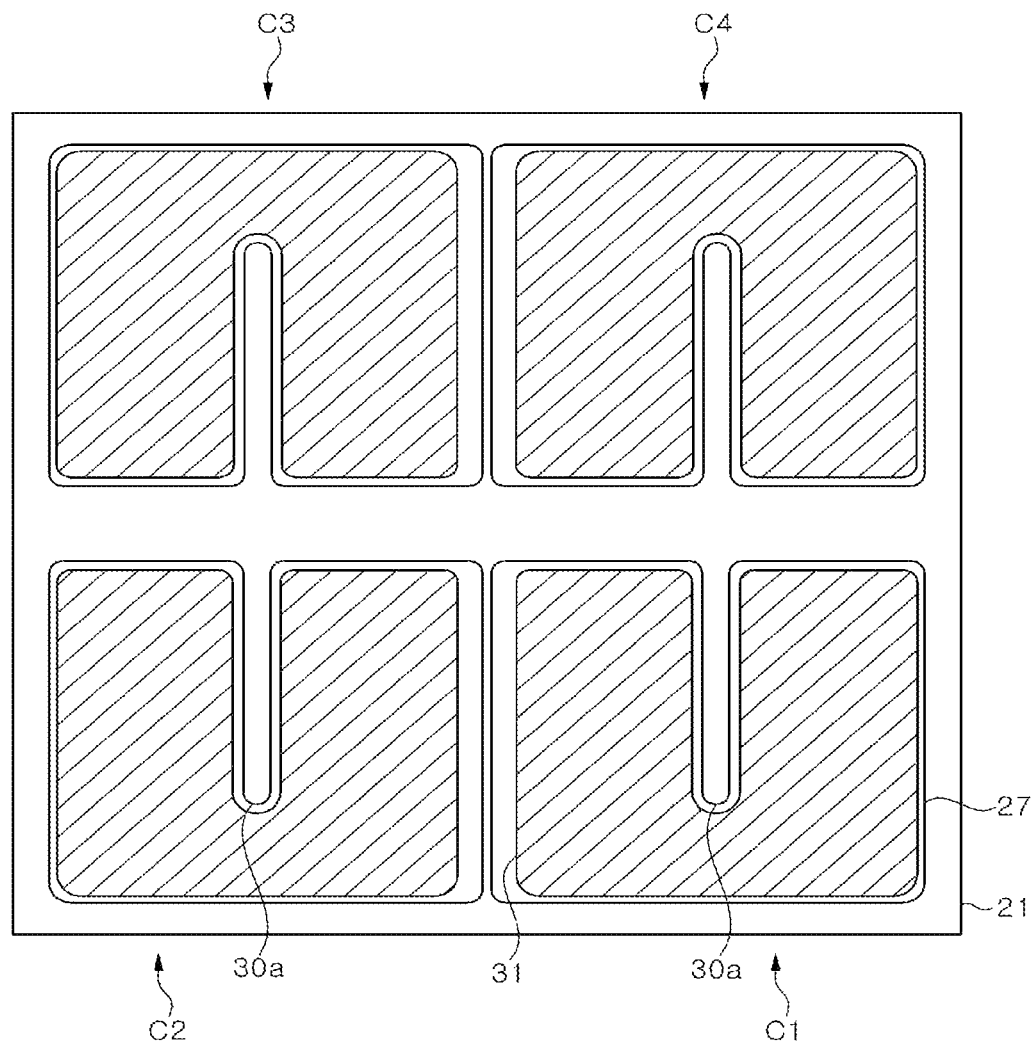

Referring to FIG. 2 and FIG. 4B, an ohmic reflection layer 31 is formed on each of the mesas. The ohmic reflection layer 31 is limitedly formed in an upper region of the second conductivity type semiconductor layer 27. The ohmic reflection layer 31 may be formed by, for example, a lift-off technique. The ohmic reflection layer 31 may be composed of a single layer or multiple layers and may include, for example, an ohmic layer and a reflection layer. These layers may be formed by, for example, e-beam evaporation. Before formation of the ohmic reflection layer 31, a preliminary insulation layer (not shown) having openings may be formed in regions in which the ohmic reflection layer 31 will be formed.

Figure 4C:
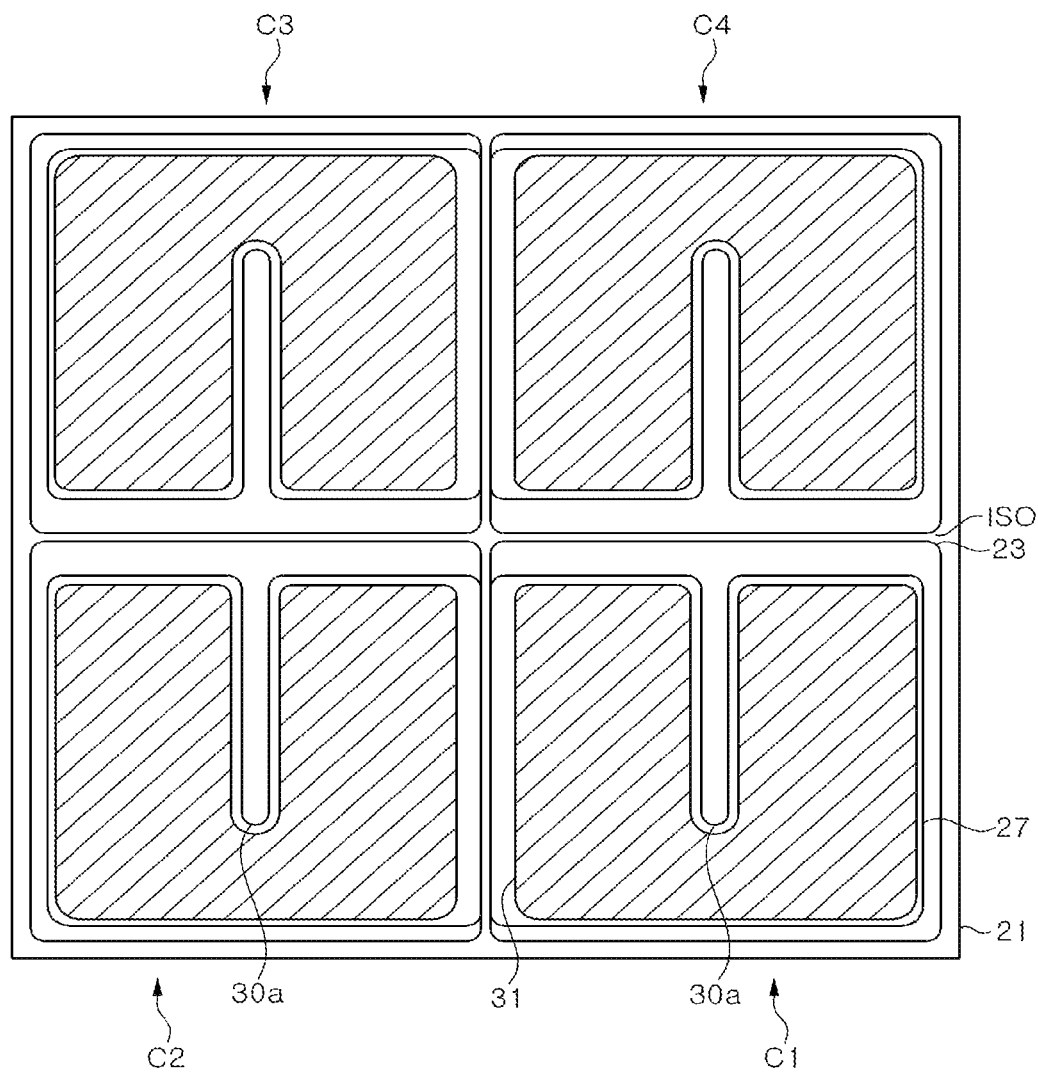

Referring to FIG. 2 and FIG. 4C, a cell isolation process is performed to form a cell isolation (ISO) region. The cell isolation process may be performed by photolithography and etching. The light emitting cells C1 to C4 are separated from each other by the cell isolation (ISO) region. The cell isolation (ISO) region may have an inclined sidewall.

As shown in FIG. 4C, the upper surface of the first conductivity type semiconductor layer 23 may be exposed near edges of the light emitting cells C1 to C4 disposed near an edge of the substrate 21. On the other hand, for at least some edges of the light emitting cells, at which the light emitting cells C1 to C4 are adjacent to each other, the second conductivity type semiconductor layer 27, the active layer 25 and the first conductivity type semiconductor layer 23 may form a continuously inclined surface. In addition, for at least some edges of the light emitting cells, at which the light emitting cells C1 to C4 are adjacent to each other, the upper surface of the first conductivity type semiconductor layer 23 may be exposed. For example, for edges of first and second light emitting cells, at which the first light emitting cell C1 is adjacent to the second light emitting cell C2, or for edges of third and fourth light emitting cells, at which the third light emitting cell C3 is adjacent to the fourth light emitting cell C4, the second conductivity type semiconductor layer 27, the active layer 25 and the first conductivity type semiconductor layer 23 form a continuously inclined surface. In addition, for the edges of the first and fourth light emitting cells, at which the first light emitting cell C1 is adjacent to the fourth light emitting cell C4, or for the edges of the second and third light emitting cells, at which the second light emitting cell C2 is adjacent to the third light emitting cell C3, the upper surface of the first conductivity type semiconductor layer 23 is exposed.

As the plurality of light emitting cells C1 to C4 is formed on the substrate 21 to be separated from each other by the cell isolation (ISO) region, the substrate has morphology with different height profiles thereon. In this morphology, an upper surface of the second conductivity type semiconductor layer 27 of each of the light emitting cells has the greatest height and the substrate 21 exposed through the cell isolation (ISO) region has the smallest height.

Although the cell isolation process is performed after formation of the mesas and the ohmic reflection layer 31 in this exemplary embodiment, it should be understood that the processes of forming the mesas, the process of forming the ohmic reflection layer 31 and the cell isolation process can be performed in a different sequence than that of this exemplary embodiment. For example, the ohmic reflection layer 31 may be performed first, followed by the mesa etching process and the cell isolation process, or the cell isolation process may be performed first, followed by the mesa etching process and the process of forming the ohmic reflection layer 31. In other exemplary embodiments, after a metal layer for the ohmic reflection layer 31 is deposited on the semiconductor stack structure 30, the ohmic reflection layer 31 and the light emitting cells C1 to C4 may be formed at the same time by patterning the metal layer and the semiconductor stack structure 30 at the same time.

Figure 4D:
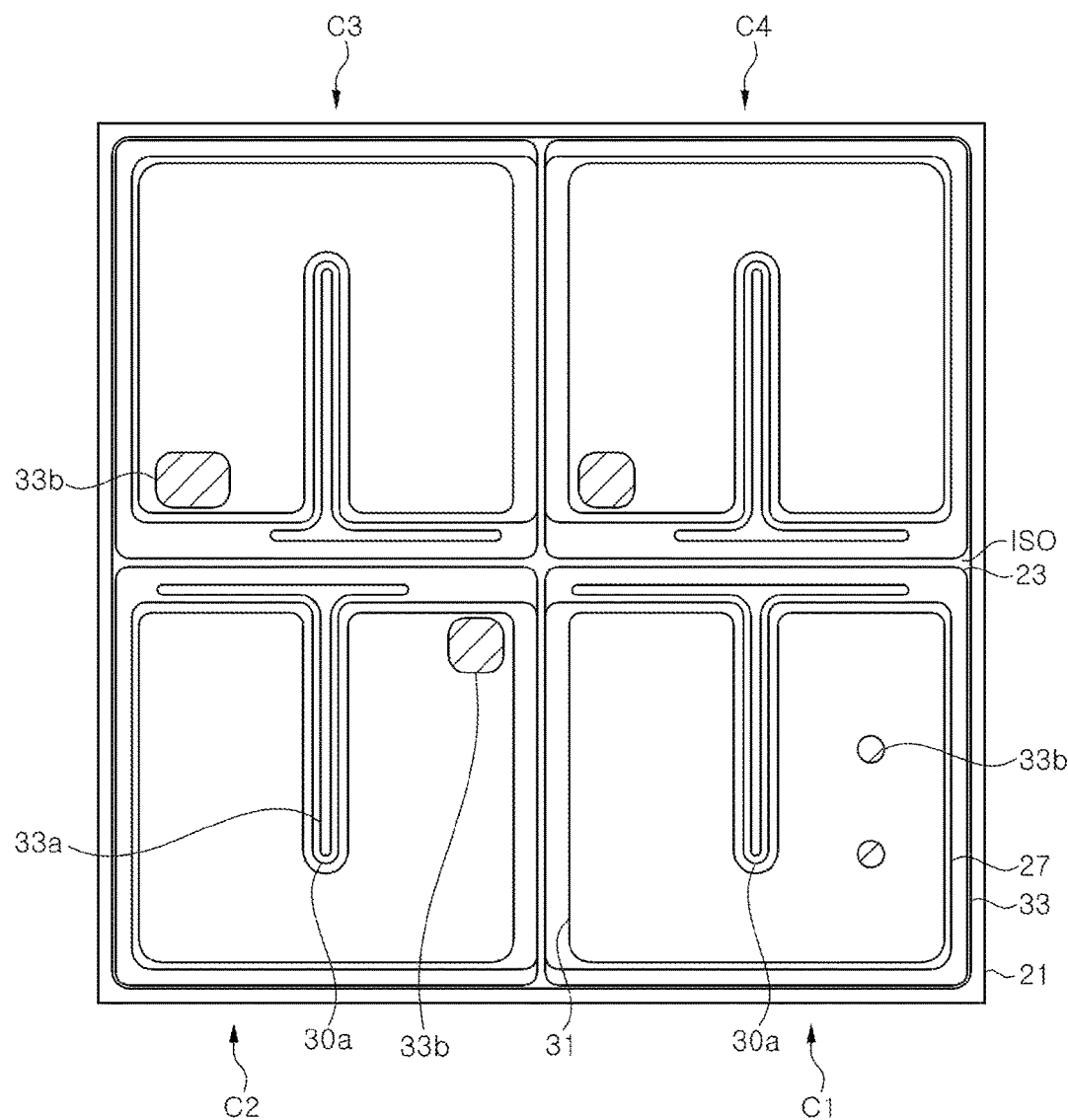

Referring to FIG. 2 and FIG. 4D, a lower insulation layer 33 is formed to cover the ohmic reflection layer 31 and the light emitting cells C1 to C4. The lower insulation layer 33 may be formed of or including an oxide layer such as $SiO_2$, a nitride layer such as SiNX, or an insulation layer such as $MgF_2$ by chemical vapor deposition (CVD) or others. The lower insulation layer 33 may be composed of a single layer or multiple layers. Further, the lower insulation layer 33 may include a distributed Bragg reflector in which high-refractive material layers and low-refractive material layers are alternately stacked one above another. For example, an insulation reflective layer having high reflectivity may be formed by laminating $SiO_2/TiO_2$ layers, $SiO_2/Nb_2O_5$ layers, $SiO_2/ZrO_2$ layers, or $MgF_2/TiO_2$ layers. The preliminary insulation layer (not shown) described above may be integrated with the lower insulation layer 33. Thus, the lower insulation layer 33 may have an uneven thickness due to the preliminary insulation layer formed around the ohmic reflection layer 31. That is, a portion of the lower insulation layer 33 on the ohmic reflection layer 31 may have a smaller thickness than a portion of the lower insulation layer 33 around the ohmic reflection layer 31.

The lower insulation layer 33 may be patterned through photolithography and etching processes. Accordingly, the lower insulation layer 33 has first openings 33a exposing the first conductivity type semiconductor layer 23 inside and outside the bays 30a, and second openings 33b exposing the ohmic reflection layer 31 on each of the light emitting cells C1 to C4. Further, the lower insulation layer 33 may expose the upper surface of the substrate 21 near the edge of the substrate 21.

Figure 4E:
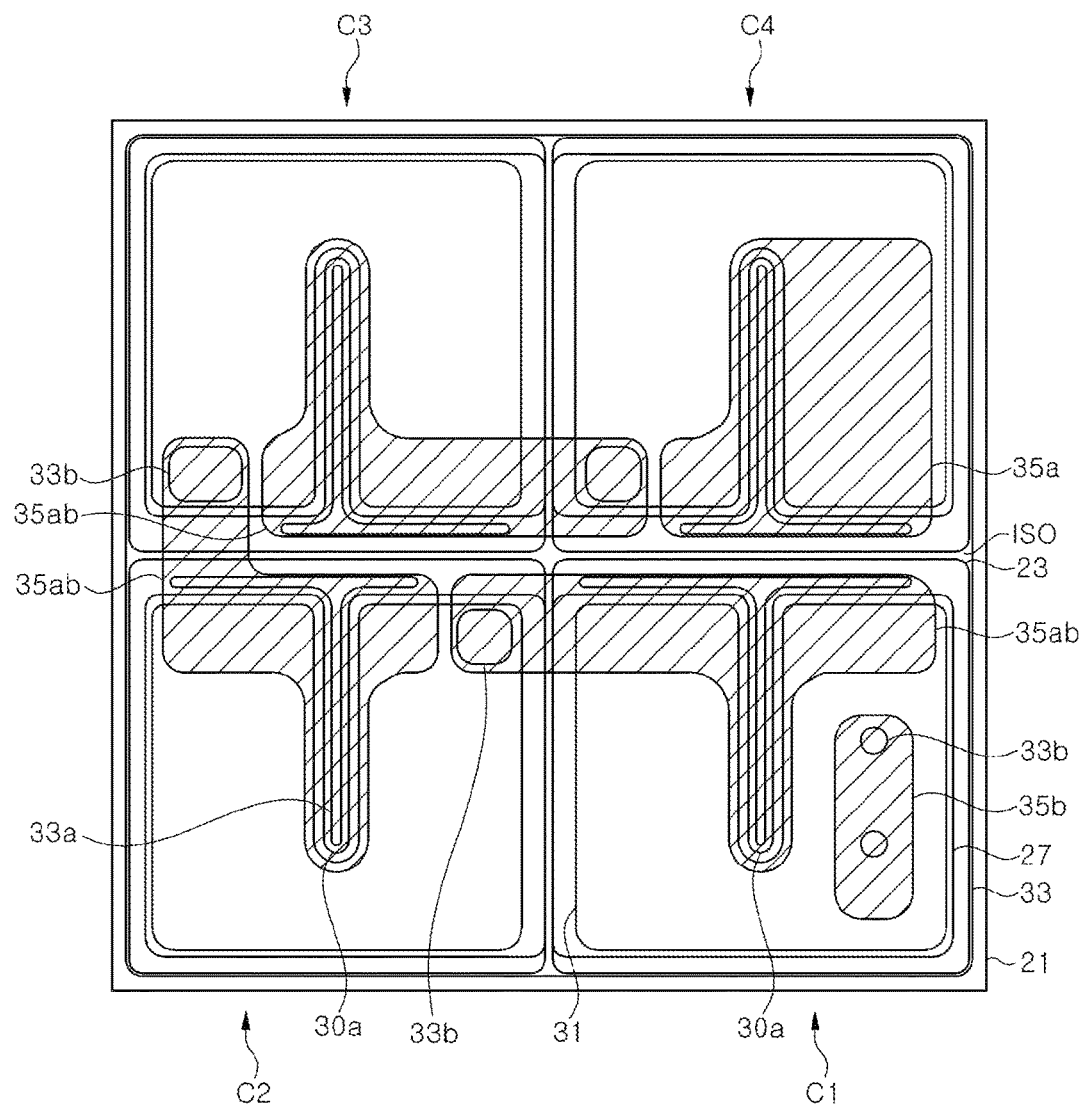

Referring to FIG. 2 and FIG. 4E, a first pad metal layer 35a, a second pad metal layer 35b, and connectors 35ab are formed on the lower insulation layer 33.

The connectors 35ab electrically connect the first light emitting cell C1 to the fourth light emitting cell C4 to one another to form a series array of the light emitting cells C1 to C4. The first and fourth light emitting cells C1 and C4 are arranged as the first and last emitting cells, respectively, in the series array of the light emitting cells and the second and third light emitting cells C2 and C3 are arranged between the first and fourth light emitting cells C1 and C4. The first light emitting cell C1 is placed to be coupled to the first terminal of the series array and the fourth light emitting cell C4 is placed to be coupled to the second terminal of the series array.

In some implementations, the connector 35ab electrically connects the first conductivity type semiconductor layer 23 of one light emitting cell to the second conductivity type semiconductor layer 27 of another light emitting cell adjacent to the one light emitting cell. The connectors 35ab may be electrically connected to the first conductivity type semiconductor layer 23 exposed in the bays 30a through the first openings 33a of the lower insulation layer 33, and may be electrically connected to the ohmic reflection layer 31 exposed through the second openings 33b of the lower insulation layer 33. Further, the connectors 35ab may directly connect the first conductivity type semiconductor layer 23 and the ohmic reflection layer 31.

The connectors 35ab pass the cell isolation (ISO) region to connect adjacent light emitting cells to each other. As shown in FIG. 4E, each of the connectors 35ab may pass or cross only one edge of the first conductivity type semiconductor layer 23 of one light emitting cell in order to reduce influence of the morphology on the substrate 21. In this exemplary embodiment, the first conductivity type semiconductor layer 23 of each of the light emitting cells has four edges and the connectors 35ab may be formed to pass or cross only one of these edges of the first conductivity type semiconductor layer 23. This structure can prevent the connectors 35ab from unnecessarily passing or crossing the cell isolation (ISO) region in electrical connection, thereby preventing damage to the connectors 35ab due to influence of the morphology. However, it should be understood that other implementations are possible and the shape of the connector 35ab can be modified in various ways.

The first pad metal layer 35a is disposed on the last light emitting cell C4 placed to be coupled to the second terminal of the series array of light emitting cells and the second pad metal layer 35b is disposed on the first light emitting cell C1 placed to be coupled to the first terminal thereof. The first pad metal layer 35a may be limitedly disposed in an upper region of the second conductivity type semiconductor layer 27 of the last light emitting cell C4 and the second pad metal layer 35b may be limitedly disposed in an upper region of the first light emitting cell C1.

The first pad metal layer 35a is electrically connected to the first conductivity type semiconductor layer 23 through the first openings 33a of the lower insulation layer 33 on the last light emitting cell C4. The first pad metal layer 35a may directly contact the first conductivity type semiconductor layer 23. Accordingly, the first pad metal layer 35a may include an ohmic layer that forms ohmic contact with the first conductivity type semiconductor layer 23.

The second pad metal layer 35b is electrically connected to the ohmic reflection layer 31 through the second opening 33b of the lower insulation layer 33 on the first light emitting cell C1. The second pad metal layer 35b may directly contact the ohmic reflection layer 31.

The first pad metal layer 35a, the second pad metal layer 35b, and the connectors 35ab may be formed of or include the same material and may be formed at the same time by the same process. For example, the first pad metal layer 35a, the second pad metal layer 35b, and the connectors 35ab may include Ti, Cr, or Ni as a bonding layer and may further include Al as a metallic reflection layer. Furthermore, the first pad metal layer 35a, the second pad metal layer 35b, and the connectors 35ab may further include an anti-diffusion layer for preventing diffusion of a metallic element, such as Sn, and an anti-oxidation layer for preventing oxidation of the anti-diffusion layer. The anti-diffusion layer may include, for example, Cr, Ti, Ni, Mo, TiW or W, and the anti-oxidation layer may include Au.

In this exemplary embodiment, the first pad metal layer 35a, the second pad metal layer 35b, and the connectors 35ab may be formed at the same time by the same process, thereby simplifying the manufacturing process.

Figure 4F:
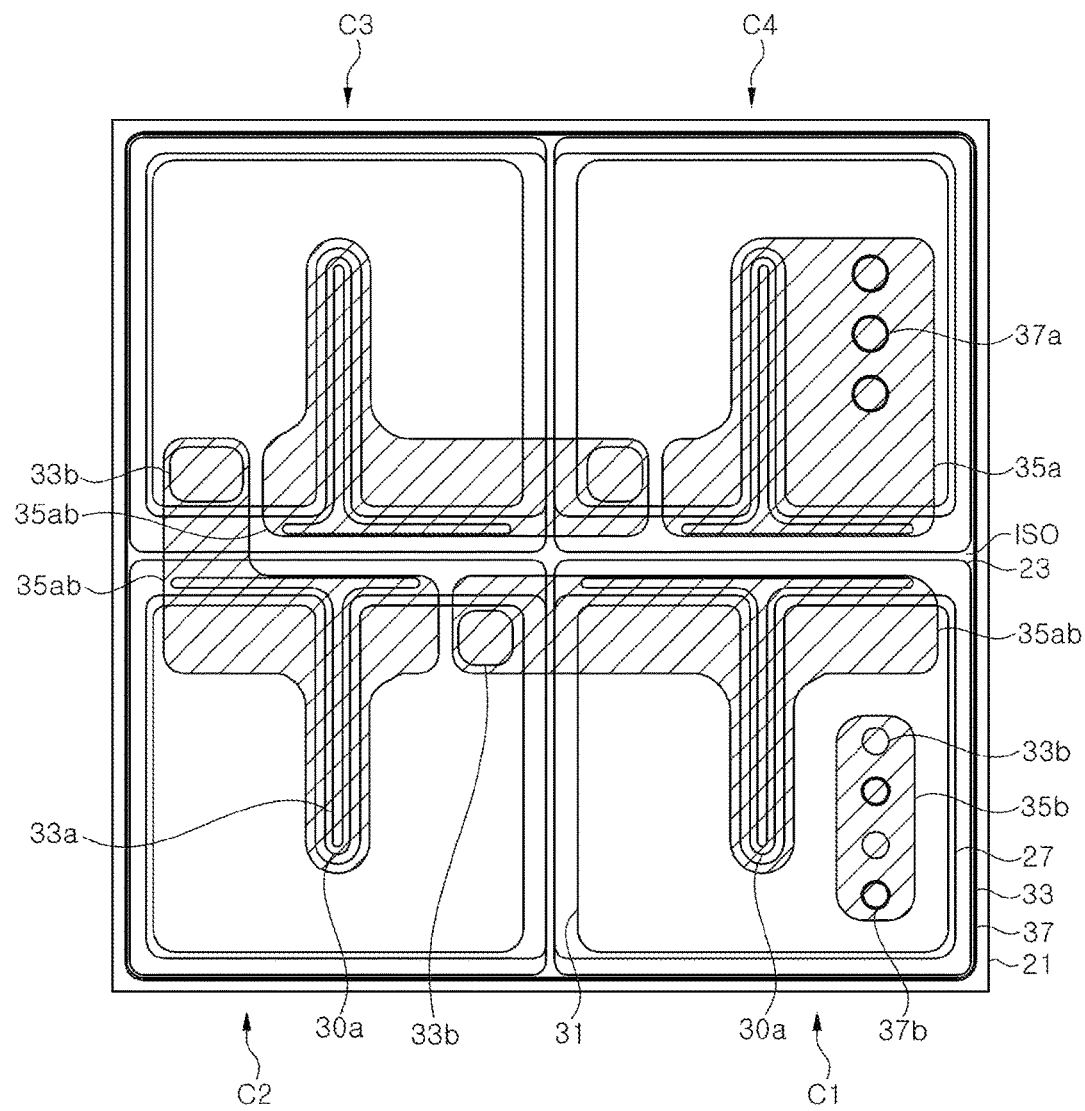

Referring to FIG. 2 and FIG. 4F, an upper insulation layer 37 is formed to cover the first pad metal layer 35a, the second pad metal layer 35b, and the connectors 35ab. The upper insulation layer 37 includes openings 37a exposing the first pad metal layer 35a and openings 37b exposing the second pad metal layer 35b. The openings 37a, 37b may be limitedly disposed in upper regions of the first pad metal layer 35a and the second pad metal layer 35b, respectively.

Although a plurality of openings 37a is illustrated in the drawings, it should be understood that the upper insulation layer 37 may include one opening 37a in other exemplary embodiments. In addition, although one opening 37b is illustrated in the drawings, it should be understood that the upper insulation layer 37 may include a plurality of openings 37b.

The openings 37b of the upper insulation layer 37 may be arranged to be spaced apart from the seconds opening 33b of the lower insulation layer 33 in the direction along which the light emitting cells C1 and C4 are arranged. With the structure wherein the openings 37b of the upper insulation layer 37 are spaced apart from the second openings 33b of the lower insulation layer 33 so as not to overlap each other, the ohmic reflection layer 31 can be prevented from being contaminated by solders. Alternatively, the second openings 33b of the lower insulation layer 33 may overlap the openings 37b of the upper insulation layer 37.

The upper insulation layer 37 may also cover the edge of the lower insulation layer 33 along the edge of the substrate 21 and may expose some region thereof near the edge of the substrate 21. The edge of the upper insulation layer 37 may be spaced apart from the connectors 35ab by a distance of at least 15 μm.

The upper insulation layer 37 may be formed of or include a silicon oxide layer or a silicon nitride layer and may include a distributed Bragg reflector.

Figure 4G:
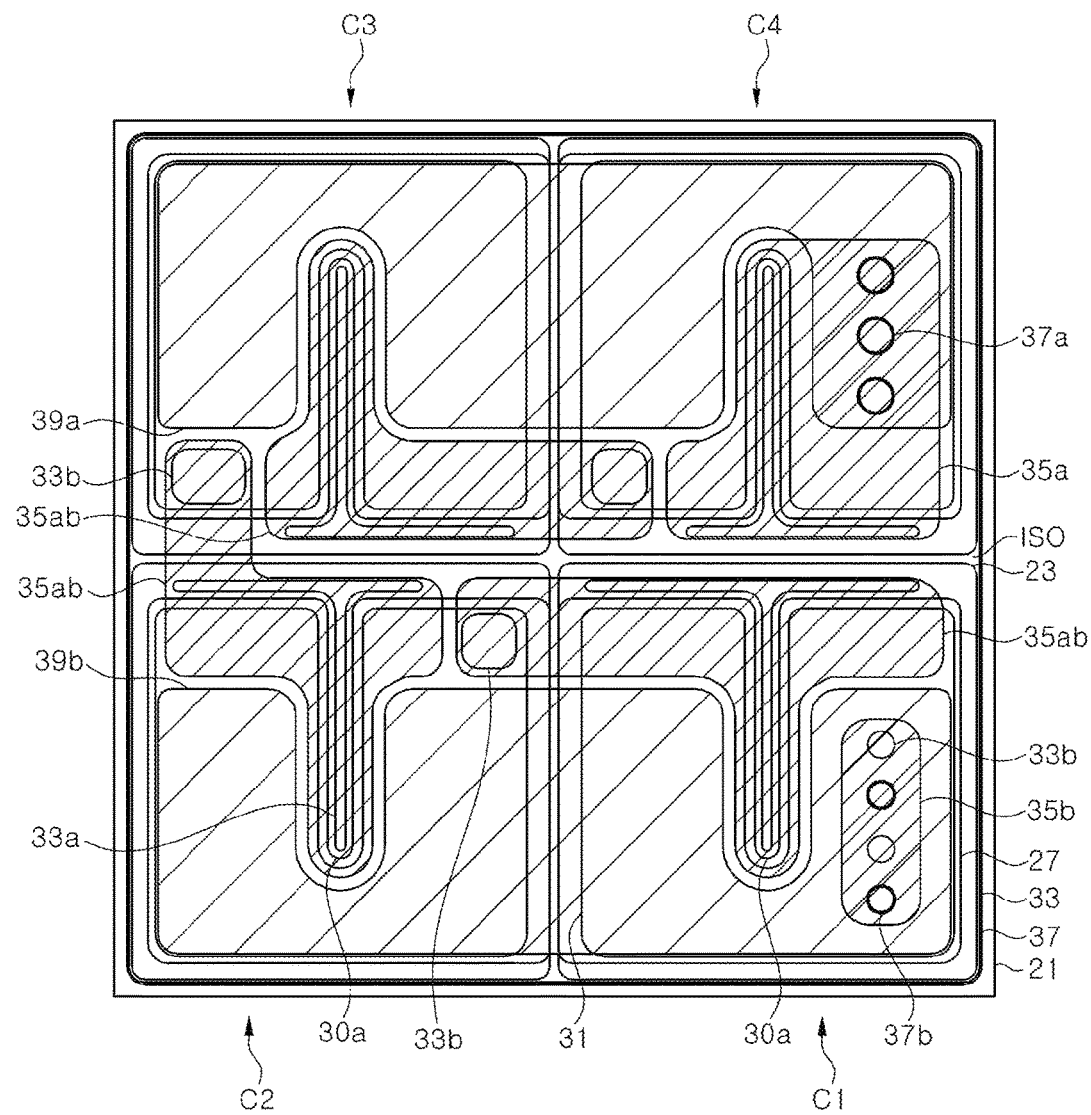

Referring to FIG. 2 and FIG. 4G, a first bump pad 39a and a second bump pad 39b are formed on the upper insulation layer 37.

The first bump pad 39a is electrically connected to the first pad metal layer 35a through the openings 37a of the upper insulation layer 37, and the second bump pad 39b is electrically connected to the second pad metal layer 35b through the openings 37b of the upper insulation layer 37.

As described with reference to FIG. 1 to FIG. 3, the first and second bump pads 39a, 39b are formed over the plurality of light emitting cells. Here, the first and second bump pads 39a, 39b are spaced apart from the connectors 35ab in a direction along which the third and four light emitting cells C3 and C4 are arranged adjacent to the second and the first light emitting cells C2 and C1, respectively. Thus, the first and second bump pads 39a, 39b and the connectors 35ab do not overlap each other along the direction. Accordingly, this structure can prevent occurrence of short circuit between the connectors 35ab and the bump pads 39a, 39b. In addition, it is possible to prevent insulation damage to the upper insulation layer due to a potential difference between the connectors 35ab and the bump pads 39a, 39b.

After the first and second bump pads 39a, 39b are formed, the thickness of the substrate 21 can be reduced by partially removing a lower surface of the substrate 21 through grinding and/or lapping. Thereafter, the substrate 21 is divided into individual chip units, thereby providing light emitting diodes separated from each other. Here, the substrate 21 may be divided by laser scribing.

Figure 5:
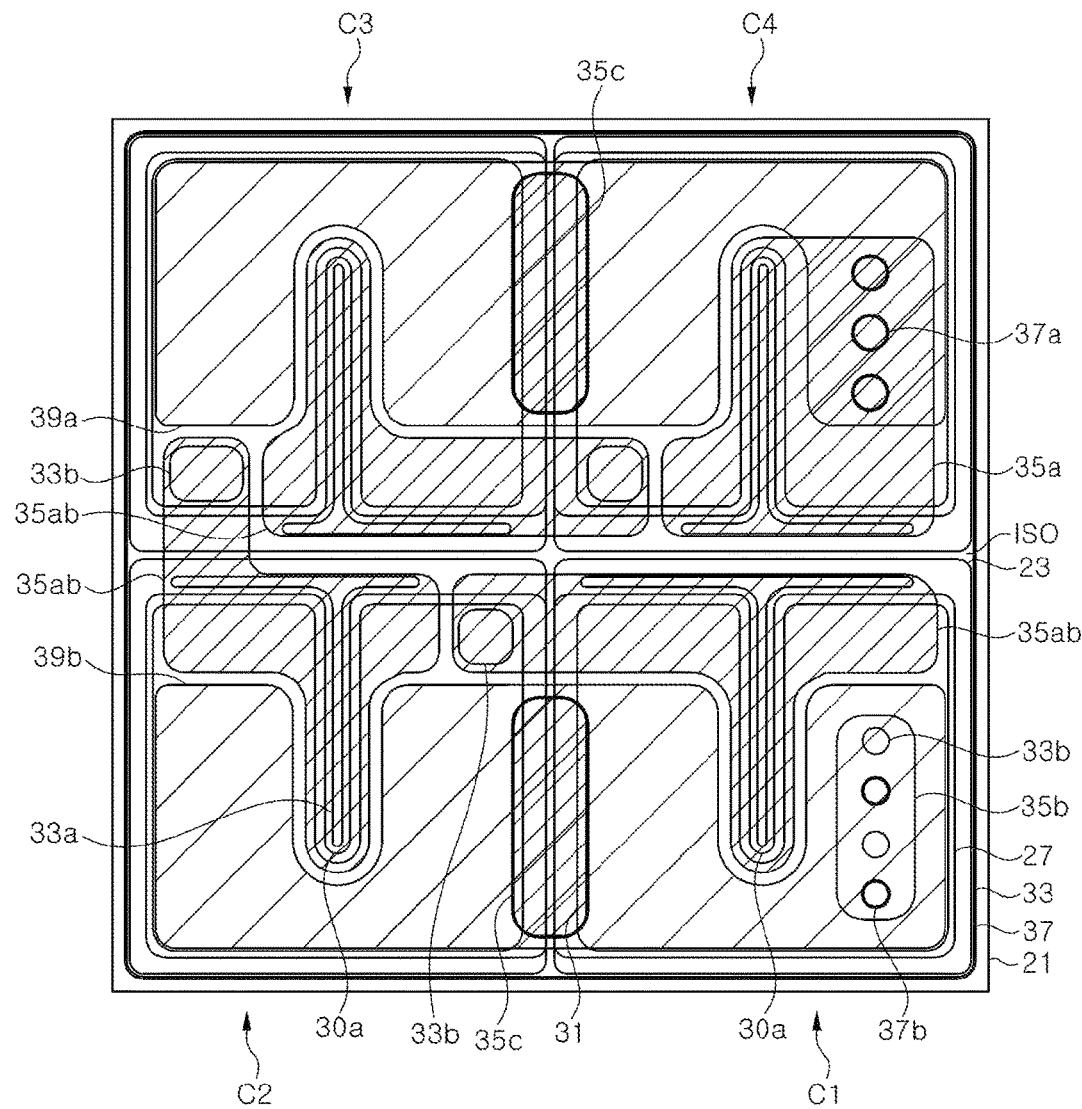
FIG. 5 is a schematic plan view of a light emitting diode according to another exemplary embodiment of the disclosed technology.

FIG. 5 is a schematic plan view of a light emitting diode according to another exemplary embodiment of the disclosed technology. The following description will focus on different features of this exemplary embodiment than those of the above exemplary embodiment shown in FIG. 1 and description of the same components will be described in brief or omitted.

Referring to FIG. 5, the light emitting diode according to this exemplary embodiment is generally similar to the light emitting diode described with reference to FIG. 1 except for a floating metal layer 35c.

The floating metal layer 35c may cover the cell isolation (ISO) region between the light emitting cells C1 to C4. In addition, the floating metal layer 35c may cover upper regions of adjacent light emitting cells. Accordingly, the floating metal layer 35c is formed on regions in which significant variation in morphology occurs. The floating metal layer 35c is formed in a region in which the connectors 35ab are not formed, and reflects light generated from the active layer 25. With this structure, the floating metal layer 35c improves luminous efficacy of the light emitting diode by preventing light loss of the light emitting diode.

The floating metal layer 35c is formed on the lower insulation layer 33 and may be placed at the same level as the connectors 35ab. Accordingly, the floating metal layer 35c may be formed of the same material as the first and second pad metal layers 35a, 35b and the connectors 35ab by the same process upon formation of the first and second pad metal layers 35a, 35b and the connectors 35ab.

The floating metal layer 35c is insulated from the first pad metal layer 35a, the second pad metal layer 35b and the connectors 35ab. In addition, the floating metal layer 35c is insulated from the ohmic reflection layer 31 and the semiconductor stack structure 30, and is thus electrically floated.

In the meantime, the floating metal layer 35c may at least partially overlap the first bump pad 39a and/or the second bump pad 39b. Since the floating metal layer 35c is electrically floated, the upper insulation layer 37 does not cause diode failure even upon occurrence of short circuit to the bump pads 39a, 39b due to damage such as cracks.

Figure 6:
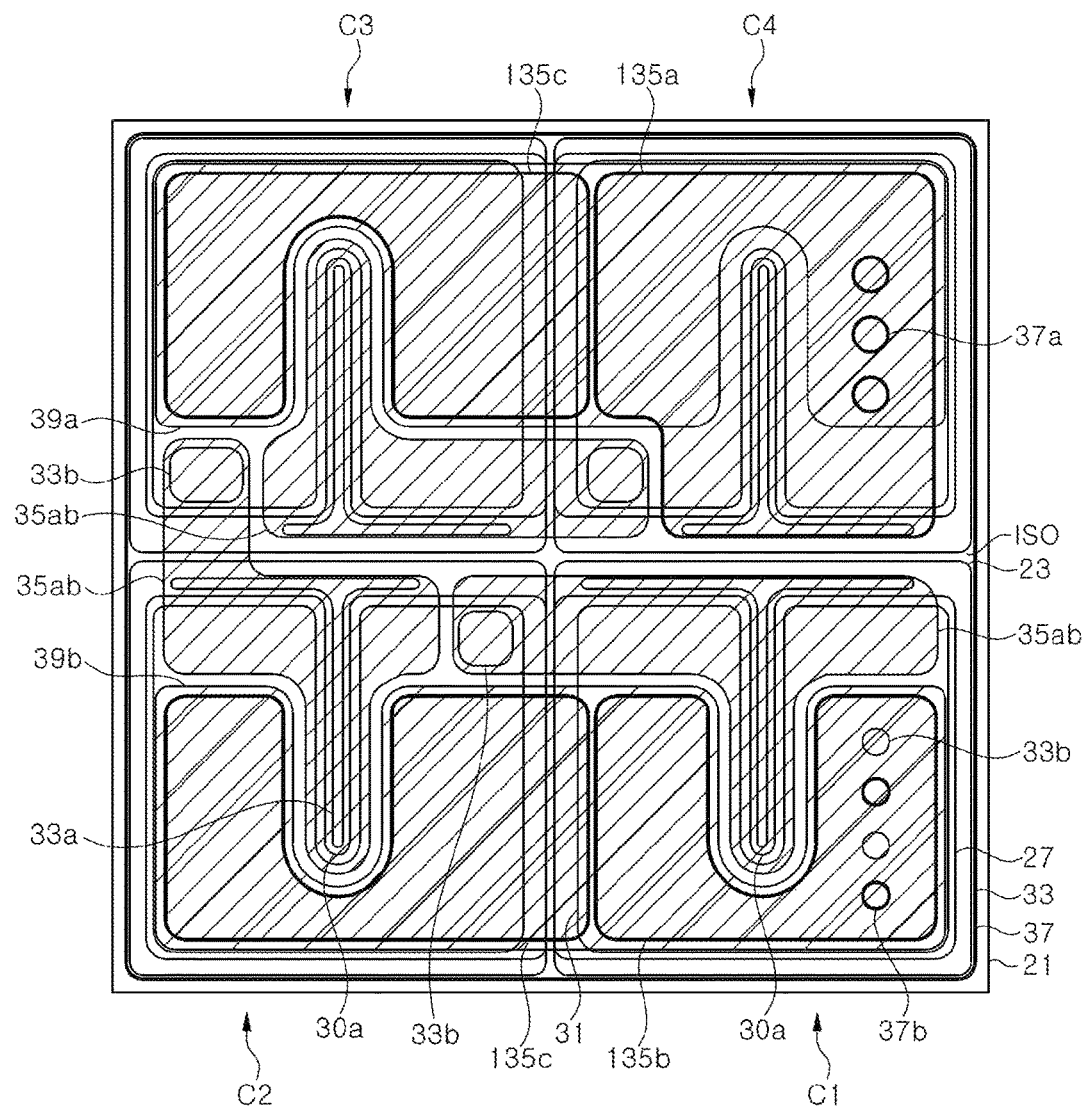
FIG. 6 is a schematic plan view of a light emitting diode according to a further exemplary embodiment of the disclosed technology.

FIG. 6 is a schematic plan view of a light emitting diode according to a further exemplary embodiment of the disclosed technology.

Referring to FIG. 6, the light emitting diode according to this exemplary embodiment is generally similar to the light emitting diode described with reference to FIG. 5 except that a first pad metal layer 135a, a second pad metal layer 135b and a floating metal layer 135c have different shapes than the first pad metal layer 35a, the second pad metal layer 35b and the floating metal layer 35c of the light emitting diode described with reference to FIG. 5.

For example, the first pad metal layer 135a covers a larger area of the fourth light emitting cell C4 than the first pad metal layer 35a and the second pad metal layer 135b also covers a larger area of the first light emitting cell C1 than the second pad metal layer 35b. Further, the floating metal layer 135c has a larger area than the floating metal layer 35c.

The floating metal layer 135c is spaced apart from the first pad metal layer 135a, the second pad metal layer 135b and the connectors 35ab, and may be placed at the same level as the first pad metal layer 135a, the second pad metal layer 135b and the connectors 35ab. With the structure wherein the first pad metal layer 135a, the second pad metal layer 135b and the floating metal layer 135c have increased areas, the light emitting diode allows rapid dissipation of heat from the active layer 25.

Figure 7:
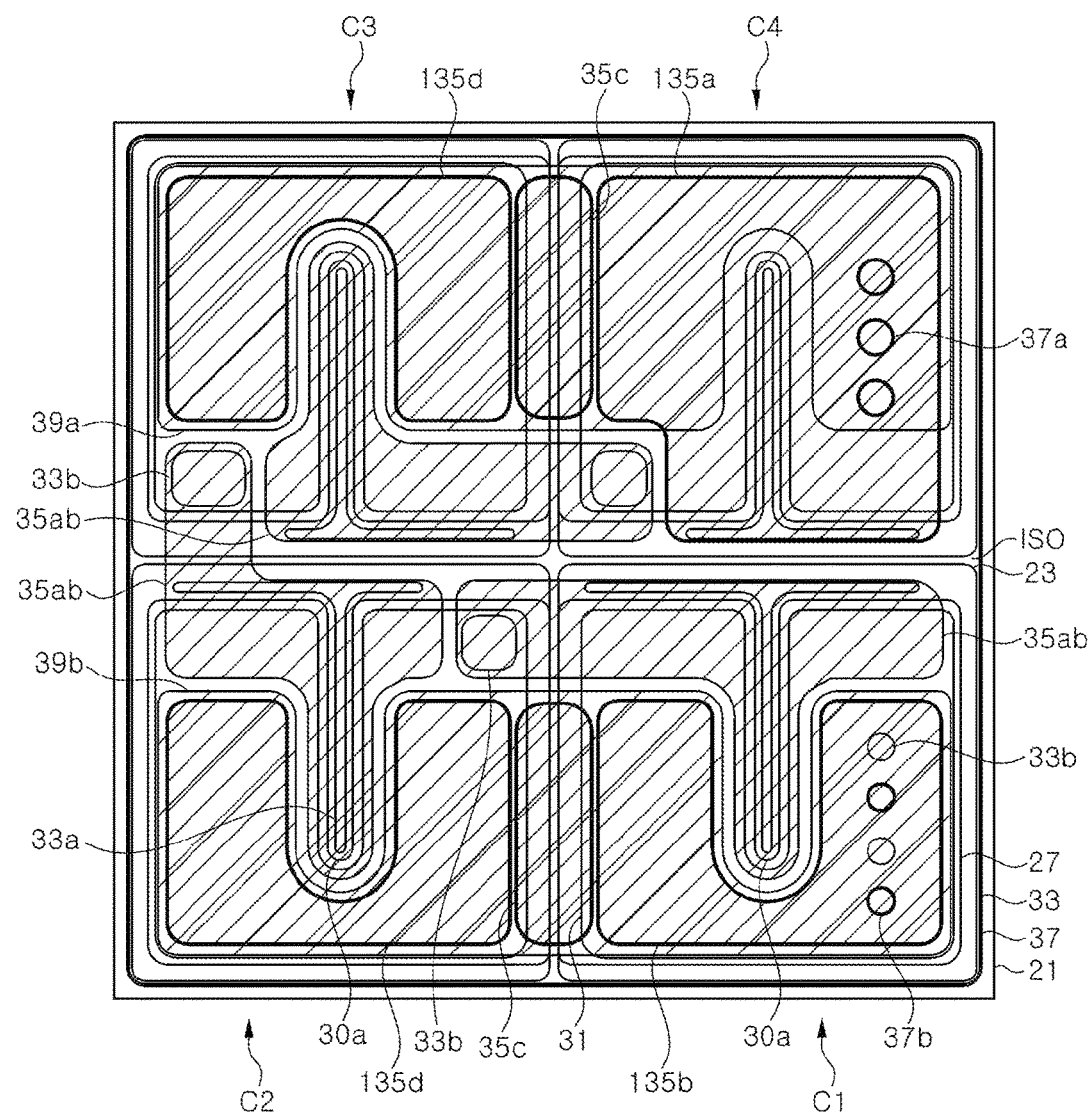
FIG. 7 is a schematic plan view of a light emitting diode according to yet another exemplary embodiment of the disclosed technology.

FIG. 7 is a schematic plan view of a light emitting diode according to yet another exemplary embodiment of the disclosed technology.

Referring to FIG. 7, the light emitting diode according to this exemplary embodiment is generally similar to the light emitting diode described with reference to FIG. 6 except that the floating metal layer 135c of FIG. 6 is divided into a plurality of regions 35c, 135d in the light emitting diode according to this exemplary embodiment.

Like the floating metal layer 35c described with reference to FIG. 5, the floating metal layer 35c according to this exemplary embodiment is formed near the cell isolation (ISO) region and the floating metal layer 135d is limitedly disposed on each of light emitting cell regions. The floating metal layer 35c may partially cover the cell isolation (ISO) region and the light emitting cell regions.

In this exemplary embodiment, the floating metal layer 35c improves light extraction efficiency by reflecting light traveling toward side surfaces of the light emitting cells and the floating metal layer 135d assists in heat dissipation of the light emitting diode.

Figure 8:
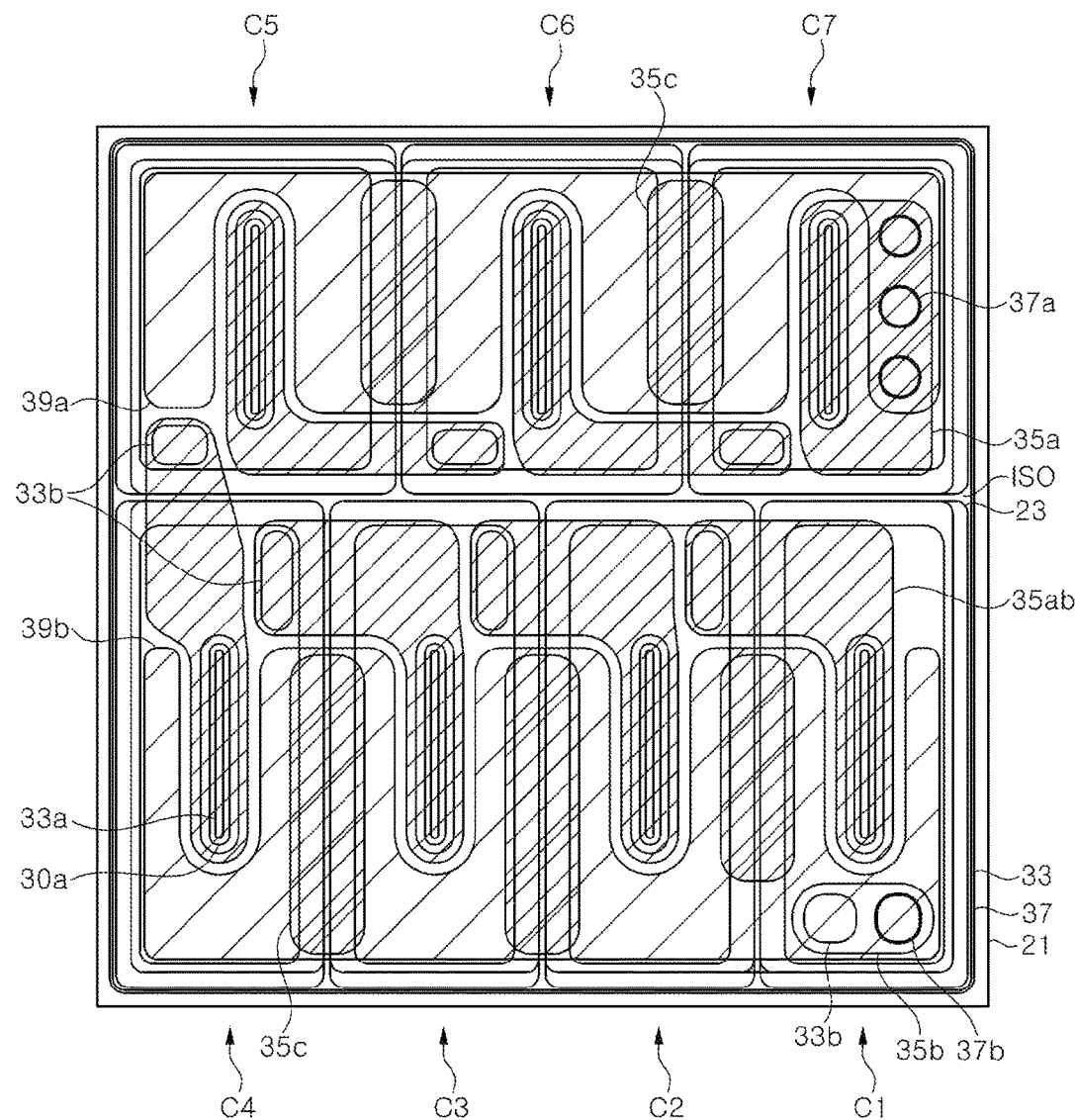
FIG. 8 is a schematic plan view of a light emitting diode according to yet another exemplary embodiment of the disclosed technology.

FIG. 8 is a schematic plan view of a light emitting diode according to yet another exemplary embodiment of the disclosed technology.

Referring to FIG. 8, the light emitting diode according to this exemplary embodiment is generally similar to the light emitting diode described with reference to FIG. 5 except that the light emitting diode according to this exemplary embodiment includes seven light emitting cells. In this exemplary embodiment, the seven light emitting cells C1 to C7 are connected to each other in series by the connectors 35ab.

The first bump pad 39a is disposed on fifth to seventh light emitting cells C5 to C7 continuously arranged side by side, and the second bump pad 39b is disposed on first to fourth light emitting cells C1 to C4 continuously arranged side by side.

The floating metal layer 35c is disposed between two adjacent light emitting cells. Alternatively, the floating metal layer 35c may be modified in various ways as described with reference to FIG. 6 and FIG. 7 or may be omitted.

Figure 9:
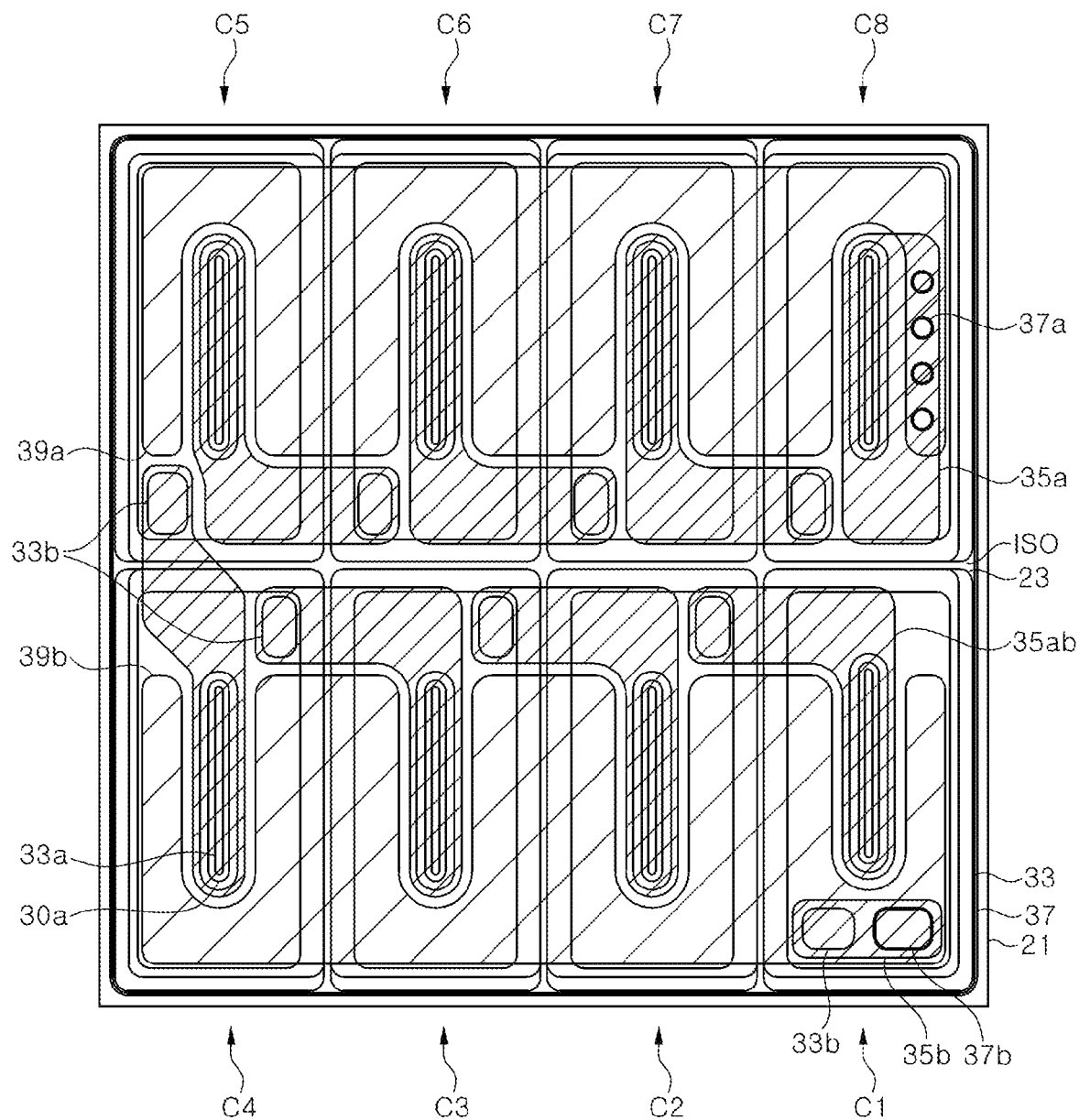
FIG. 9 is a schematic plan view of a light emitting diode according to yet another exemplary embodiment of the disclosed technology.

FIG. 9 is a schematic plan view of a light emitting diode according to yet another exemplary embodiment of the disclosed technology.

Referring to FIG. 9, the light emitting diode according to this exemplary embodiment is generally similar to the light emitting diode described with reference to FIG. 8 except that the light emitting diode according to this exemplary embodiment includes eight light emitting cells C1 to C8.

The first bump pad 39a is disposed on fifth to eighth light emitting cells C5 to C8 continuously arranged side by side, and the second bump pad 39b is disposed on first to fourth light emitting cells C1 to C4 continuously arranged side by side. With the eight light emitting cells, the light emitting diode includes the light emitting cells including the same area and the first and second bump pads 39a, 39b may be arranged in a symmetrical structure.

Although the floating metal layer is not shown in FIG. 9, the light emitting diode may include various types of floating metal layers 35c, 135c, 135d.

Figure 10:
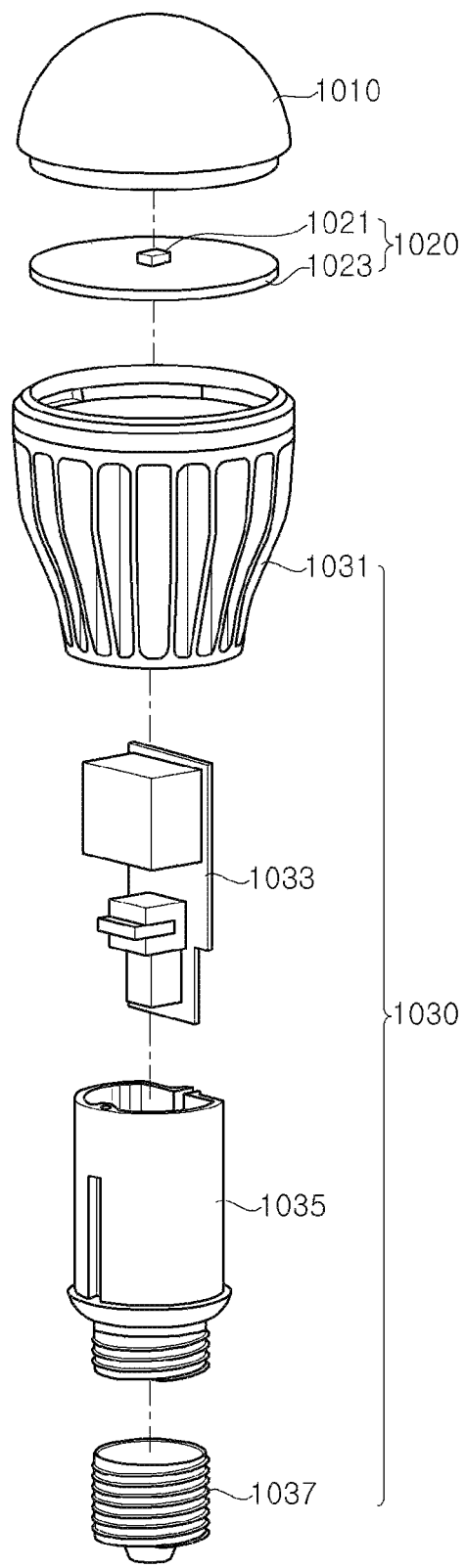
FIG. 10 is an exploded perspective view of a lighting apparatus to which a light emitting diode according to exemplary embodiments of the disclosed technology is applied.

FIG. 10 is an exploded perspective view of a lighting apparatus to which a light emitting diode according to one exemplary embodiment is applied.

Referring to FIG. 10, the lighting apparatus according to this exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 11:
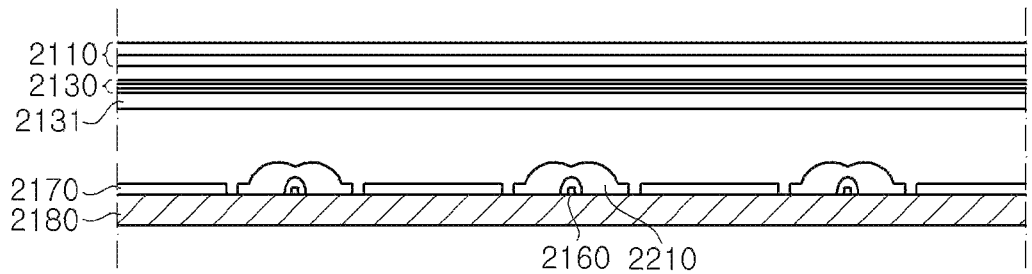
FIG. 11 is a cross-sectional view of one embodiment of a display apparatus to which a light emitting diode according to exemplary embodiments of the disclosed technology is applied.

FIG. 11 is a cross-sectional view of one embodiment of a display apparatus to which a light emitting diode according to exemplary embodiments of the disclosed technology is applied.

The display apparatus according to this exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this exemplary embodiment.

Figure 12:
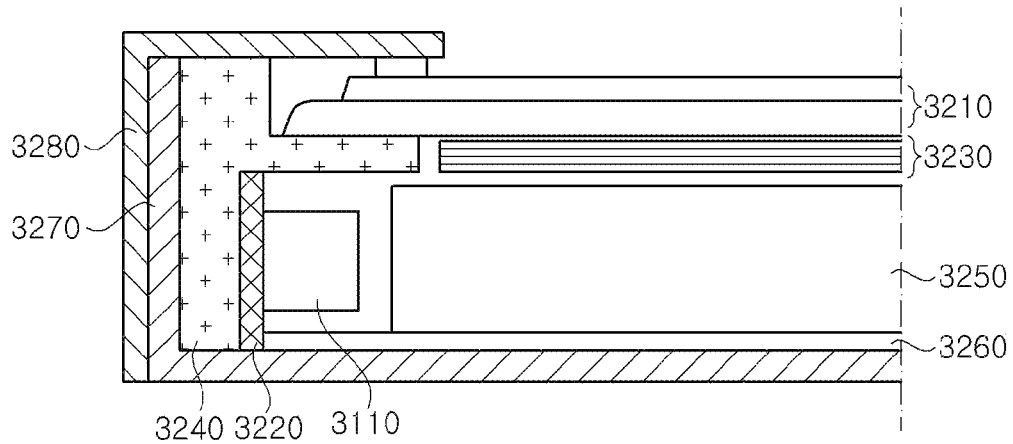
FIG. 12 is a cross-sectional view of another embodiment of a display apparatus to which a light emitting diode according to exemplary embodiments of the disclosed technology is applied.

FIG. 12 is a cross-sectional view of another embodiment of the display apparatus to which a light emitting diode according to exemplary embodiments of the disclosed technology is applied.

The display apparatus according to this exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to this exemplary embodiment.

Figure 13:
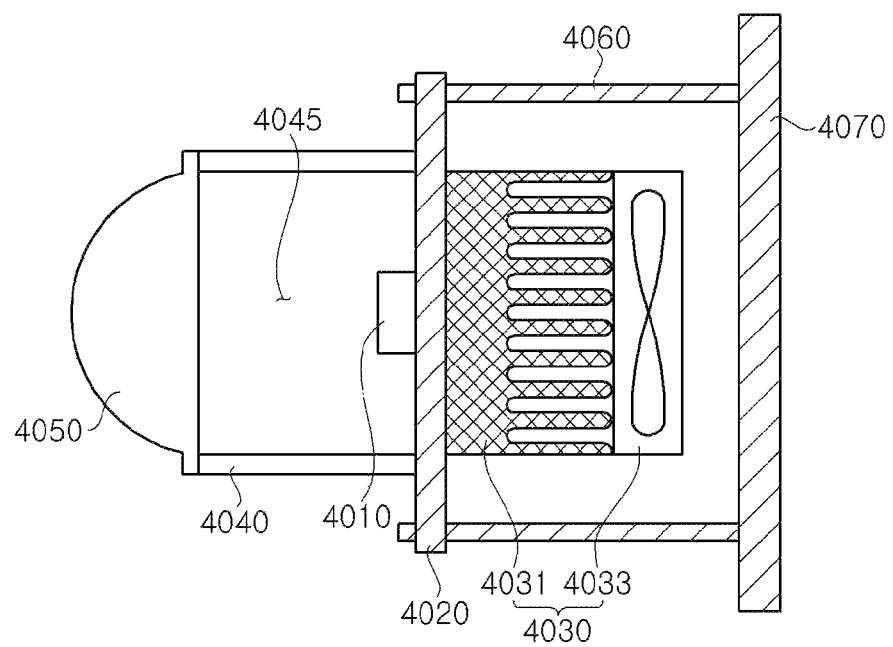
FIG. 13 is a cross-sectional view of a headlight to which a light emitting diode according to exemplary embodiments of the disclosed technology is applied.

FIG. 13 is a cross-sectional view of a headlight to which a light emitting diode according to exemplary embodiments of the disclosed technology is applied.

Referring to FIG. 13, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights, particularly, vehicular headlights, like the headlight according to this exemplary embodiment.

Although some exemplary embodiments have been described herein, it should be understood that these embodiments are provided for illustration only and are not to be construed in any way as limiting the disclosed technology. It should be understood that features or components of one exemplary embodiment may also be applied to other exemplary embodiments without departing from the spirit and scope of the disclosed technology.

We claim:

1. A light emitting diode device comprising:
an array of light emitting cells including a plurality of light emitting cells arranged in series in a flow direction of an electrical current flowing through the plurality of light emitting cells, the plurality of light emitting cells including two adjacent light emitting cells spaced apart from each other by a cell isolation region and each light emitting cell including a first conductivity type semiconductor layer, an active layer, and a second conductivity type semiconductor layer;
an ohmic reflection layer disposed on the second conductivity type semiconductor layer of each of the light emitting cells to form ohmic contact with the second conductivity type semiconductor layer;
a lower insulation layer covering the light emitting cells and the ohmic reflection layer, the lower insulation layer having first openings exposing the first conductivity type semiconductor layer of each of the light emitting cells and second openings exposing the ohmic reflection layer of each of the light emitting cells;
a connector disposed on the lower insulation layer and electrically connecting the two adjacent light emitting cells to each other, the connector disposed over less than all of the cell isolation region;
a first pad metal layer electrically connected to the first conductivity type semiconductor layer of one of the light emitting cells disposed last in the flow direction through the first openings of the lower insulation layer;
a second pad metal layer electrically connected to the ohmic reflection layer of another of the light emitting cells disposed first in the flow direction through the second openings of the lower insulation layer;
an upper insulation layer covering the connector and the first and second pad metal layers, the upper insulation layer having a third opening and a fourth opening exposing upper surfaces of the first and second pad metal layers, respectively; and
a first bump pad and a second bump pad that are respectively connected to the upper surfaces of the first pad metal layer and the second pad metal layer exposed through the third and fourth openings,
wherein the connector is spaced apart from the first and second bump pads along a direction and does not overlap the first and second bump pads along the direction.

2. The light emitting diode device of claim 1, wherein each of the light emitting cells at least partially overlaps at least one of the first and second bump pads.

3. The light emitting diode device of claim 2, wherein each of the first and second bump pads are disposed over at least two light emitting cells.

4. The light emitting diode device of claim 1, wherein the first pad metal layer is disposed within an upper region of the last light emitting cell and the second pad metal layer is disposed within an upper region of the first light emitting cell.

5. The light emitting diode device of claim 4, wherein the first and second pad metal layers are spaced apart from the connector.

6. The light emitting diode device of claim 1, wherein the connector and the first and second pad metal layers include the same material and placed at the same level.

7. The light emitting diode device of claim 1, wherein the second opening of the lower insulation layer is spaced apart from the opening of the upper insulation layer exposing the second pad metal layer in the direction.

8. The light emitting diode device of claim 1, wherein at least one light emitting cell comprises a bay or a via-hole formed through the second conductivity type semiconductor layer and the active layer to expose the first conductivity type semiconductor layer, and the connector is electrically connected to the first conductivity type semiconductor layer of the light emitting cell through the exposure region.

9. The light emitting diode device of claim 1, wherein the upper insulation layer covers a region between an outermost edge of the substrate and edges of the light emitting cells and a distance between an edge of the upper insulation layer and the connector is 15 μm or more.

10. The light emitting diode device of claim 1, wherein the connector directly contacts the first conductivity type semiconductor layer exposed through the first openings and the ohmic reflection layer exposed through the second openings.

11. The light emitting diode device of claim 1, further comprising:
at least one floating metal layer disposed on the lower insulation layer and covered by the upper insulation layer,
wherein each floating metal layer is insulated from the first pad metal layer, the second pad metal layer and the connector.

12. The light emitting diode device of claim 11, wherein the at least one floating metal includes a same material as the connector and the first and second pad metal layers.

13. The light emitting diode device of claim 12, wherein the at least one floating metal layer comprises a floating metal layer partially covering a region between two adjacent light emitting cells.

14. The light emitting diode device of claim 11, wherein the at least one floating metal layer comprises a plurality of floating metal layers and at least one of the floating metal layers has a same shape as the second pad metal layer.

15. The light emitting diode device of claim 1, further comprising: a substrate on which the plurality of light emitting cells is disposed.

16. A light emitting diode device comprising:
an array of light emitting cells including a plurality of light emitting cells arranged in series in a flow direction of an electrical current flowing through the plurality of light emitting cells, the plurality of light emitting cells including two adjacent light emitting cells spaced apart from each other by a cell isolation region and each light emitting cell including a first conductivity type semiconductor layer, an active layer, and a second conductivity type semiconductor layer;
a lower insulation layer covering the light emitting cells and having openings on each of the light emitting cells;
a connector disposed on the lower insulation layer and electrically connecting the two adjacent light emitting cells to each other, the connector disposed over less than all of the cell isolation region;
a first pad metal layer electrically connected to the first conductivity type semiconductor layer of one of the light emitting cells disposed last in the flow direction through some of the openings of the lower insulation layer;
a second pad metal layer electrically connected to the second conductivity type semiconductor layer of another of the light emitting cells disposed first in the flow direction through the others of the openings of the lower insulation layer;
an upper insulation layer covering the connector and the first and second pad metal layers, the upper insulation layer having openings exposing upper surfaces of the first and second pad metal layers, respectively; and
a first bump pad and a second bump pad that are respectively connected to the upper surfaces of the first pad metal layer and the second pad metal layer exposed through the openings of the upper insulation layer,
wherein the connector is spaced apart from the first and second bump pads in a direction and does not overlap the first and second bump pads in the direction.

* * * * *